United States Patent
Park et al.

(10) Patent No.: US 11,746,121 B2
(45) Date of Patent: Sep. 5, 2023

(54) MOLYBDENUM COMPOUND AND METHOD OF MANUFACTURING INTEGRATED CIRCUIT DEVICE USING THE SAME

(71) Applicant: SAMSUNG ELECTRONICS CO., LTD., Suwon-si (KR)

(72) Inventors: Gyuhee Park, Hwaseong-si (KR); Younjoung Cho, Hwaseong-si (KR); Haruyoshi Sato, Tokyo (JP); Kazuki Harano, Tokyo (JP); Hiroyuki Uchiuzou, Tokyo (JP)

(73) Assignees: SAMSUNG ELECTRONICS CO., LTD., Suwon-si (KR); ADEKA CORPORATION, Tokyo (JP)

( * ) Notice: Subject to any disclaimer, the term of this patent is extended or adjusted under 35 U.S.C. 154(b) by 326 days.

(21) Appl. No.: 17/072,096

(22) Filed: Oct. 16, 2020

(65) Prior Publication Data

US 2021/0300955 A1    Sep. 30, 2021

(30) Foreign Application Priority Data

Mar. 25, 2020 (KR) .......... 10-2020-0036442

(51) Int. Cl.
| | |
|---|---|
| *C23C 16/40* | (2006.01) |
| *C07F 11/00* | (2006.01) |
| *C01G 39/02* | (2006.01) |
| *C23C 16/34* | (2006.01) |
| *C01B 21/06* | (2006.01) |

(52) U.S. Cl.
CPC ............ *C07F 11/00* (2013.01); *C01B 21/062* (2013.01); *C01G 39/02* (2013.01); *C23C 16/34* (2013.01); *C23C 16/405* (2013.01)

(58) Field of Classification Search
CPC .................................................. C07F 11/005
See application file for complete search history.

(56) References Cited

U.S. PATENT DOCUMENTS

| | | | |
|---|---|---|---|
| 7,754,908 B2 | 7/2010 | Reuter et al. | |
| 7,959,986 B2 | 6/2011 | Peters et al. | |
| 9,175,023 B2 | 11/2015 | Odedra et al. | |
| 9,802,220 B2 | 10/2017 | Heys et al. | |
| 10,094,021 B2 | 10/2018 | Lansalot-Matras et al. | |
| 2007/0160761 A1* | 7/2007 | Reuter ................... | C23C 16/18 427/255.394 |
| 2015/0371859 A1* | 12/2015 | Sato ................. | H01L 21/76841 438/681 |
| 2016/0002786 A1 | 1/2016 | Gatineau et al. | |
| 2017/0125538 A1* | 5/2017 | Sharangpani ......... | H01L 27/108 |
| 2017/0204126 A1* | 7/2017 | Dussarrat ............. | H10K 50/824 |
| 2017/0268107 A1* | 9/2017 | Lansalot-Matras ......................... | C23C 16/45553 |
| 2018/0019165 A1 | 1/2018 | Baum et al. | |
| 2018/0127873 A1 | 5/2018 | Sarnet et al. | |
| 2018/0286668 A1 | 10/2018 | Baum et al. | |
| 2019/0003050 A1 | 1/2019 | Dezelah et al. | |

OTHER PUBLICATIONS

T. Thiede et al., ECS Transactions, 593-600 (2009) (Year: 2009).*

* cited by examiner

*Primary Examiner* — Alexander R Pagano
(74) *Attorney, Agent, or Firm* — Lee IP Law, P.C.

(57) ABSTRACT

A molybdenum compound and a method of manufacturing an integrated circuit device, the molybdenum compound being represented by the following General Formula (I):

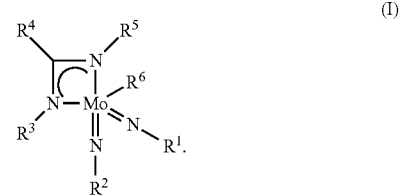

(I)

20 Claims, 15 Drawing Sheets

MOLYBDENUM COMPOUND AND METHOD OF MANUFACTURING INTEGRATED CIRCUIT DEVICE USING THE SAME

CROSS-REFERENCE TO RELATED APPLICATION

Korean Patent Application No. 10-2020-0036442, filed on Mar. 25, 2020, in the Korean Intellectual Property Office, and entitled: "Molybdenum Compound and Method of Manufacturing Integrated Circuit Device Using the Same," is incorporated by reference herein in its entirety.

BACKGROUND

1. Field

Embodiments relate to a molybdenum compound and a method of manufacturing an integrated circuit (IC) device using the molybdenum compound.

2. Description of the Related Art

Due to the development of electronic technology, the downscaling of semiconductor devices has rapidly progressed, and thus, patterns included in electronic devices have been miniaturized.

SUMMARY

The embodiments may be realized by providing a molybdenum compound represented by the following General Formula (I):

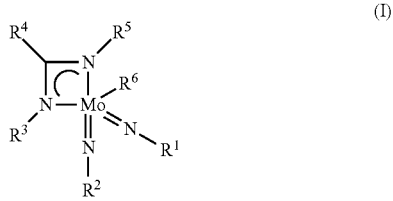

wherein $R^1$, $R^2$, $R^3$, $R^4$, $R^5$, and $R^6$ are each independently a C1 to C12 alkyl group, a C2 to C12 alkenyl group, a C2 to C12 alkynyl group, or a halogen atom.

The embodiments may be realized by providing a method of manufacturing an integrated circuit device, the method comprising forming a molybdenum-containing film on a substrate using a molybdenum compound represented by the following General Formula (I):

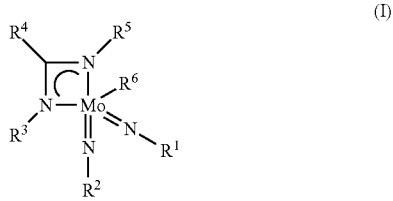

wherein $R^1$, $R^2$, $R^3$, $R^4$, $R^5$, and $R^6$ are each independently a C1 to C12 alkyl group, a C2 to C12 alkenyl group, a C2 to C12 alkynyl group, or a halogen atom.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
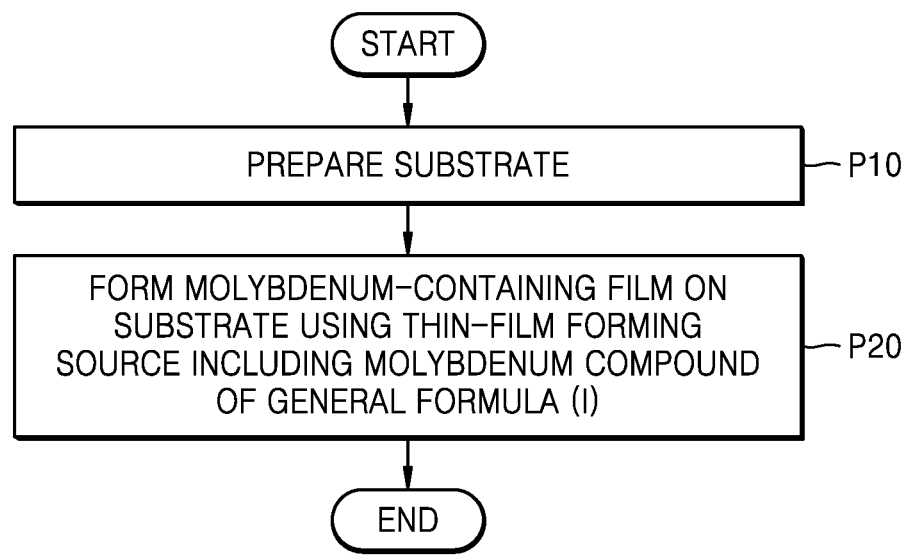
FIG. 1 is a flowchart of a method of manufacturing an integrated circuit (IC) device, according to embodiments.

When the term "substrate" is used herein, it should be understood as either the substrate itself or a stack structure including the substrate and a predetermined layer or film formed on a surface of the substrate. When the expression "a surface of a substrate" is used herein, it should be understood as either as an exposed surface of the substrate itself or an outer surface of a predetermined layer or film formed on the substrate.

As used herein, the abbreviation "Me" refers to a methyl group, the abbreviation "Et" refers to an ethyl group, the abbreviation "Pr" refers to a propyl group, an abbreviation "iPr" refers to an isopropyl group, the abbreviation "nBu" refers to a normal butyl group, the abbreviation "sBu" refers to a sec-butyl group (or a 1-methylpropyl group), the abbreviation "tBu" refers to a tert-butyl group (or a 1,1-dimethylethyl group); the abbreviation "iBu" refers to an iso-butyl group (or a 2-methylpropyl group), the abbreviation "tAm" refers to a tert-pentyl group (or a 1,1-dimethylpropyl group), and the abbreviation "Np" refers to a neopentyl group (or a 2,2-dimentylpropyl group).

As used herein, the term "room temperature" or "ambient temperature" refers to a temperature ranging from about 20° C. to about 28° C. and may vary depending on the season.

A molybdenum compound or complex according to an embodiment may have an amidinate ligand. The molybdenum compound according to the embodiment may be represented by the following General Formula (I):

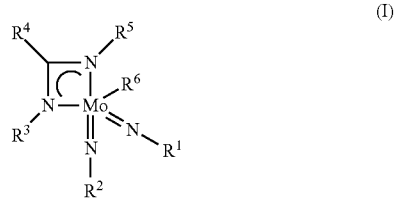

In General Formula (2), $R^1$, $R^2$, $R^3$, $R^4$, $R^5$, and $R^6$ may each independently be or include, e.g., a C1 to C12 alkyl group, a C2 to C12 alkenyl group, a C2 to C12 alkynyl group, or a halogen atom. As used herein, the term "or" is not an exclusive term, e.g., "A or B" would include A, B, or A and B.

The C1 to C12 alkyl group may be a C1 to C12 linear alkyl group or a C1 to C12 branched alkyl group. In an implementation, the C1 to C12 alkyl group may be, e.g., methyl, ethyl, n-propyl, isopropyl, n-butyl, isobutyl, sec-butyl, tert-butyl, 2-ethylbutyl, n-pentyl, isopentyl, sec-pentyl, tert-pentyl, neopentyl, 3-pentyl, n-hexyl, 2-hexyl, 3-hexyl, n-heptyl, 2-heptyl, 3-heptyl, isoheptyl, tert-heptyl, n-octyl, isooctyl, tert-octyl, 2-ethylhexyl, nonyl, isononyl, decyl, undecyl, 1-methylundecyl, dodecyl, or tridecyl.

The C2 to C12 alkenyl group may be a C2 to C12 linear alkenyl group or a C2 to C12 branched alkenyl group. In an implementation, the C2 to C12 alkenyl group may be, e.g., vinyl, 1-propenyl, 2-propenyl, 1-butenyl, 2-butenyl, or 3-butenyl.

The C2 to C12 alkynyl group may be a C2 to C12 linear alkynyl group or a C2 to C12 branched alkynyl group. In an implementation, the C2 to C12 alkynyl group may be, e.g., ethynyl, 1-propynyl, 2-propynyl, 1-butynyl, 2-butynyl, 3-butynyl, or 1-methylpent-2-ynyl.

The halogen atom may be a fluorine (F) atom, a chlorine (Cl) atom, a bromine (Br) atom, or an iodine (I) atom.

If the number of carbon atoms of at least one of $R^1$, $R^2$, $R^3$, $R^4$, $R^5$, and $R^6$ were to exceed 12, the molybdenum compound may not be suitable for a thin-film forming source because a melting point of the molybdenum compound may be increased.

In an implementation, $R^1$, $R^2$, $R^3$, $R^4$, $R^5$, and $R^6$ may each independently be or include, e.g., a C1 to C8 linear alkyl group or a C1 to C8 branched alkyl group.

In an implementation, at least one of $R^1$, $R^2$, $R^3$, $R^4$, $R^5$, and $R^6$ may be, e.g., a C1 to C8 linear alkyl group. In an implementation, each of $R^4$ and $R^6$ may be a methyl group.

In an implementation, at least one of $R^1$, $R^2$, $R^3$, $R^4$, $R^5$, and $R^6$ may be, e.g., a C1 to C8 branched alkyl group. In an implementation, at least one of $R^1$, $R^2$, $R^3$, and $R^5$ may be, e.g., a C1 to C8 branched alkyl group. In an implementation, at least one of $R^1$, $R^2$, $R^3$, and $R^5$ may be, e.g., an isopropyl group, a sec-butyl group, a tert-butyl group, a tert-pentyl group, or a neopentyl group. In an implementation, each of $R^1$, $R^2$, $R^3$, and $R^5$ may independently be, e.g., a branched alkyl group, a melting point of the molybdenum compound of General Formula (I) may be lowered, and the molybdenum compound of General Formula (I) may be highly likely to be a liquid at room temperature.

In an implementation, at least one of $R^4$ and $R^6$ may be a halogen atom. In an implementation, at least one of $R^4$ and $R^6$ may be an F atom or a Cl atom. In an implementation, at least one of $R^1$, $R^2$, $R^3$, $R^4$, $R^5$, and $R^6$ may be an F atom, and the volatility of the molybdenum compound of General Formula (I) may be improved. Accordingly, when a molybdenum-containing film is formed by an atomic layer deposition (ALD) process using the molybdenum compound of General Formula (I), the uniformity and step coverage of the molybdenum-containing film may be improved.

In an implementation, one of $R^4$ and $R^6$ may be, e.g., a halogen atom, and the other one of $R^4$ and $R^6$ may be a C1 to C8 linear alkyl group or a C1 to C8 branched alkyl group.

In an implementation, $R^1$, $R^2$, $R^3$, and $R^5$ may each independently be, e.g., a C1 to C8 branched alkyl group, and $R^4$ and $R^6$ may each independently be, e.g., a C1 to C8 linear alkyl group or a halogen atom.

The molybdenum compound according to the embodiments may have a molecular weight of about 250 to about 1,000, e.g., about 300 to about 600. Maintaining the molecular weight of the molybdenum compound at about 250 or greater may help ensure that the molybdenum compound has sufficient thermal stability. Maintaining the molecular weight of the molybdenum compound at about 1,000 or less may help ensure that the molybdenum compound does not have an excessively high melting point and thus may be easy to use as a thin-film forming source.

The molybdenum compound according to the embodiments may be a liquid at room temperature. When a molybdenum compound is a liquid at room temperature, it may be easy to handle the molybdenum compound.

A temperature at which the thermal decomposition of the molybdenum compound according to the embodiments is initiated may be about 250° C. or higher, e.g., about 270° C. or higher. When the molybdenum compound according to the embodiments was heated under conditions of a pressure of 10 Torr and a heating rate of 10° C./min and measured using thermogravimetry-differential thermal analysis (TG-DTA) under reduced pressure, a 50% mass reduction temperature was about 280° C. or lower, e.g., about 260° C. or lower.

In an implementation, the molybdenum compound may be represented by, e.g., one of the following Formulae 1 to 108.

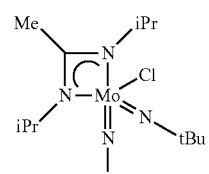

Formula 1

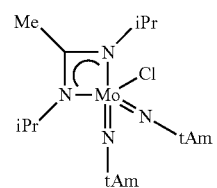

Formula 2

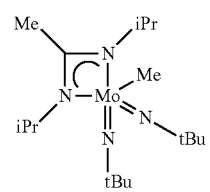

Formula 3

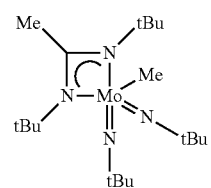

Formula 4

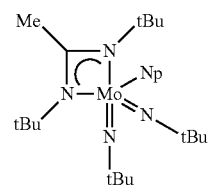

Formula 5

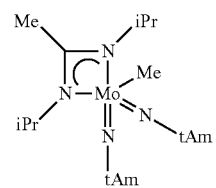

Formula 6

-continued
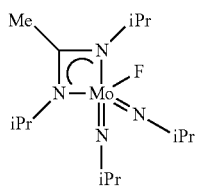
Formula 7
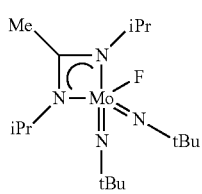
Formula 8
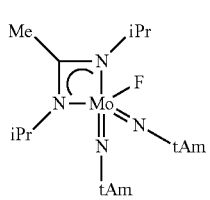
Formula 9
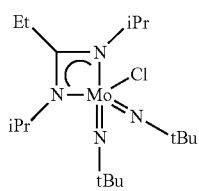
Formula 10
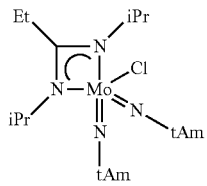
Formula 11
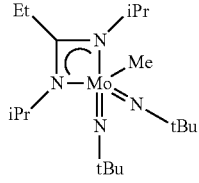
Formula 12
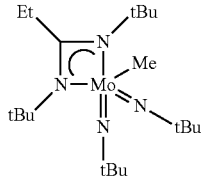
Formula 13
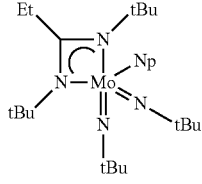
Formula 14
-continued
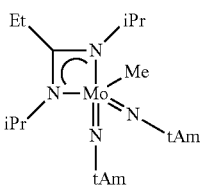
Formula 15
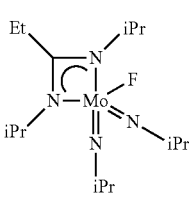
Formula 16
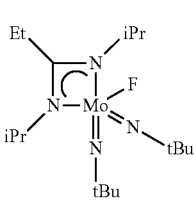
Formula 17
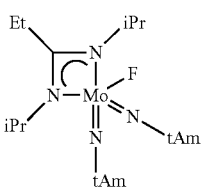
Formula 18
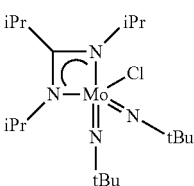
Formula 19
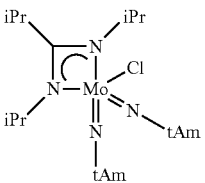
Formula 20
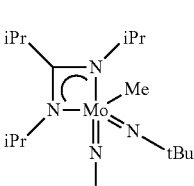
Formula 21
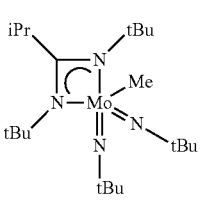
Formula 22

-continued
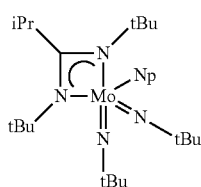
Formula 23
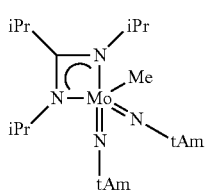
Formula 24
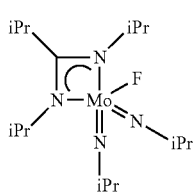
Formula 25
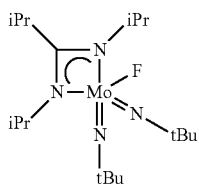
Formula 26
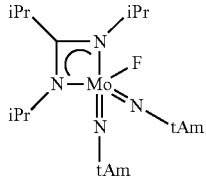
Formula 27
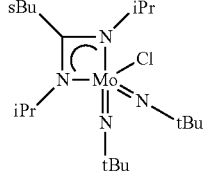
Formula 28
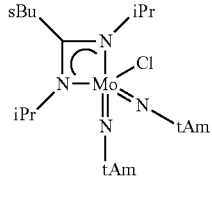
Formula 29
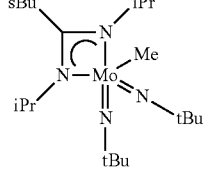
Formula 30
-continued
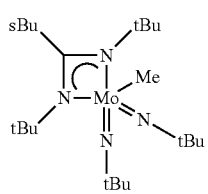
Formula 31
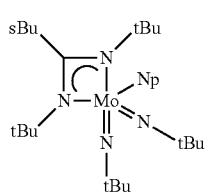
Formula 32
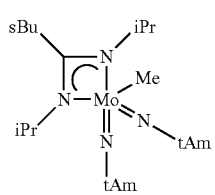
Formula 33
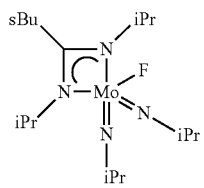
Formula 34
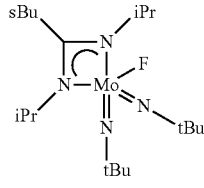
Formula 35
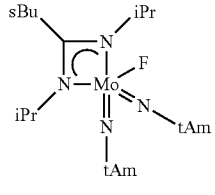
Formula 36
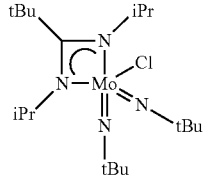
Formula 37
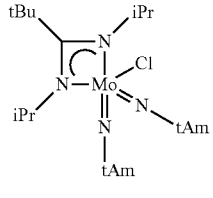
Formula 38

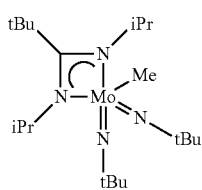
Formula 39
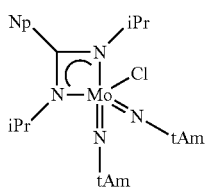
Formula 47
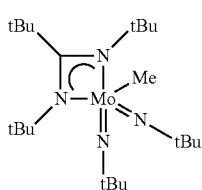
Formula 40
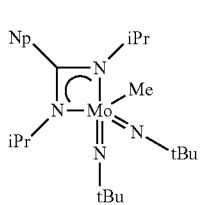
Formula 48
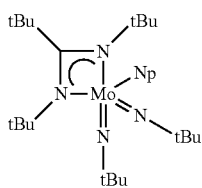
Formula 41
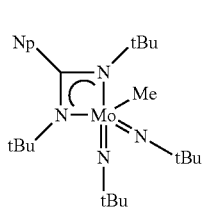
Formula 49
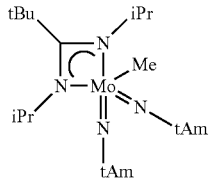
Formula 42
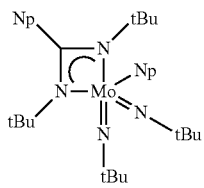
Formula 50
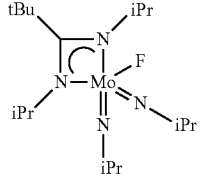
Formula 43
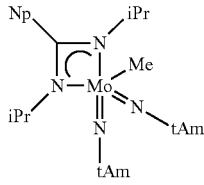
Formula 51
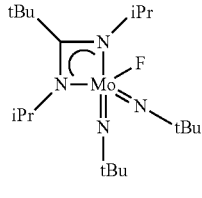
Formula 44
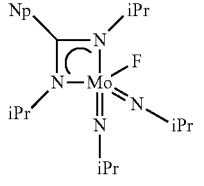
Formula 52
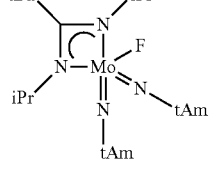
Formula 45
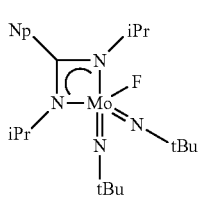
Formula 53
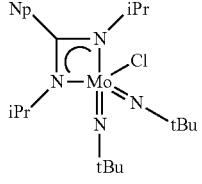
Formula 46
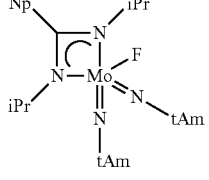
Formula 54

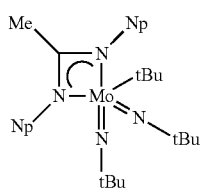 Formula 55
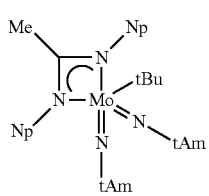 Formula 56
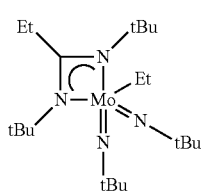 Formula 57
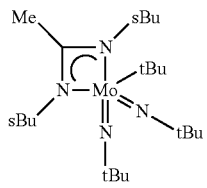 Formula 58
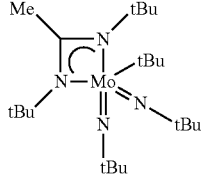 Formula 59
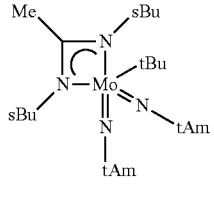 Formula 60
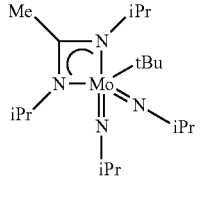 Formula 61
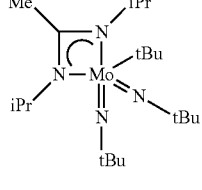 Formula 62
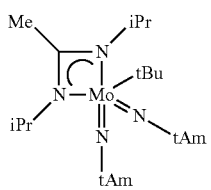 Formula 63
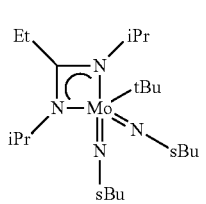 Formula 64
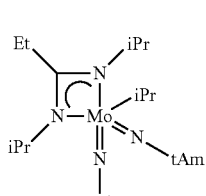 Formula 65
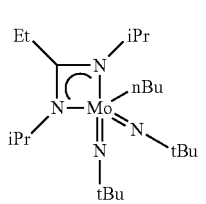 Formula 66
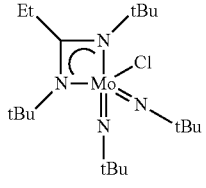 Formula 67
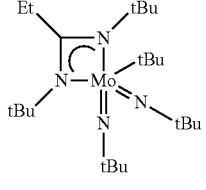 Formula 68
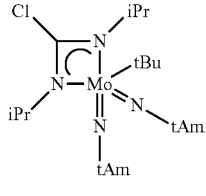 Formula 69
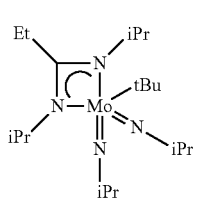 Formula 70

-continued
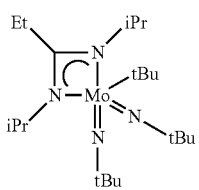
Formula 71
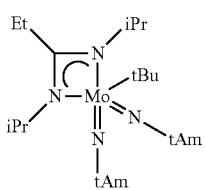
Formula 72
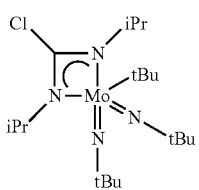
Formula 73
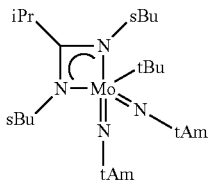
Formula 74
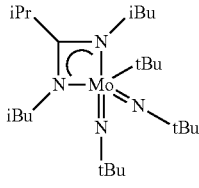
Formula 75
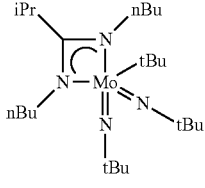
Formula 76
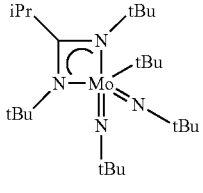
Formula 77
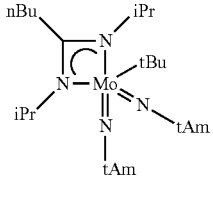
Formula 78
-continued
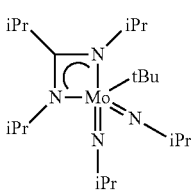
Formula 79
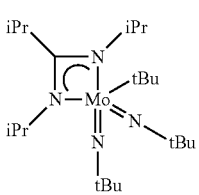
Formula 80
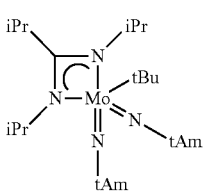
Formula 81
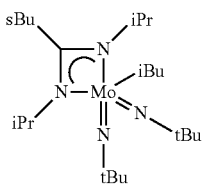
Formula 82
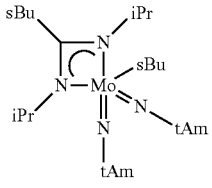
Formula 83
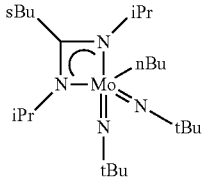
Formula 84
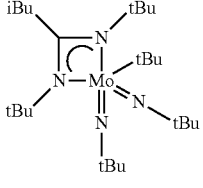
Formula 85
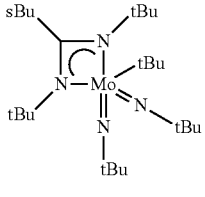
Formula 86

-continued
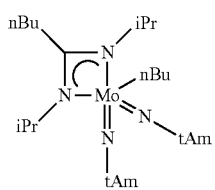
Formula 87
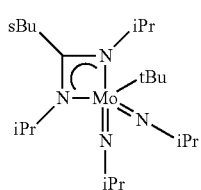
Formula 88
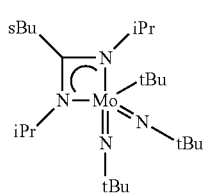
Formula 89
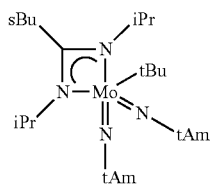
Formula 90
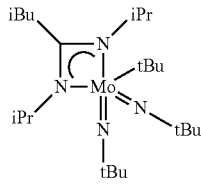
Formula 91
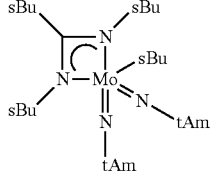
Formula 92
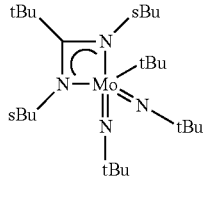
Formula 93
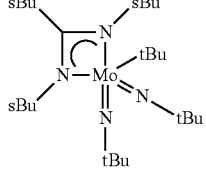
Formula 94
-continued
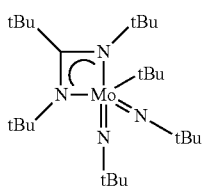
Formula 95
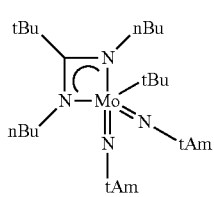
Formula 96
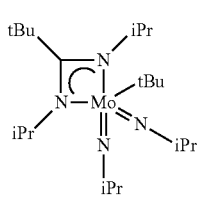
Formula 97
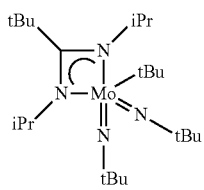
Formula 98
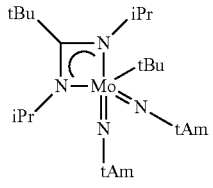
Formula 99
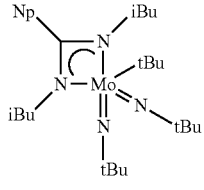
Formula 100
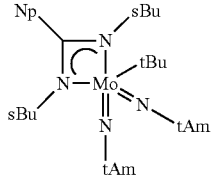
Formula 101
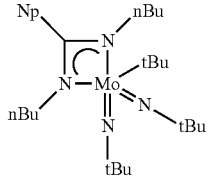
Formula 102

-continued

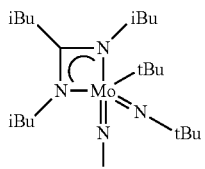

Formula 103

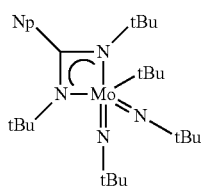

Formula 104

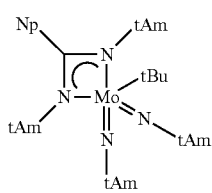

Formula 105

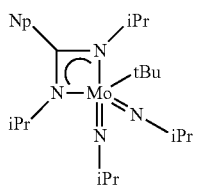

Formula 106

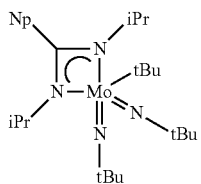

Formula 107

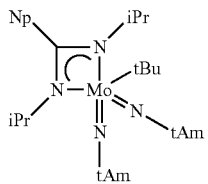

Formula 108

The molybdenum compound may be prepared by a suitable reaction.

The molybdenum compound according to the embodiments may be appropriately used for a chemical vapor deposition (CVD) process or an ALD process.

FIG. 1 is a flowchart of a method of manufacturing an integrated circuit (IC) device, according to embodiments.

Referring to FIG. 1, a substrate may be prepared in a process P10.

The substrate may include silicon, ceramics, glass, a metal, or a combination thereof. The ceramics may include silicon nitride, titanium nitride, tantalum nitride, titanium oxide, niobium oxide, zirconium oxide, hafnium oxide, lanthanum oxide, or a combination thereof. The metal may include titanium (Ti), tantalum (Ta), cobalt (Co), ruthenium (Ru), zirconium (Zr), hafnium (Hf), lanthanum (La), or a combination thereof. A surface of the substrate may have a planar structure or a three-dimensional (3D) structure such as a trench structure or the like.

In an implementation, the substrate may have the same configuration as a substrate 310 that will be described below with reference to FIG. 4A.

In a process P20 of FIG. 1, a molybdenum-containing film may be formed on the substrate using a thin-film forming source including a molybdenum compound of General Formula (I).

The thin-film forming source may include the molybdenum compound according to the embodiment described above. In an implementation, the thin-film forming source may include at least one of the molybdenum compounds represented by Formulae 1 to 108. In an implementation, the molybdenum compound included in the thin-film forming source may be a liquid at room temperature.

The thin-film forming source may vary with a thin film intended to be formed. In an implementation, the molybdenum-containing film may be a molybdenum film including only molybdenum (e.g., non-compounded molybdenum), and the thin-film forming source may not contain metal compounds or semimetal compounds other than the molybdenum compound according to the embodiment. In an implementation, the molybdenum-containing film may be a film including two or more metals or semimetals, and the thin-film forming source may include a compound (referred to as the term "another precursor" hereinafter) including a desired metal or semimetal, in addition to the molybdenum compound according to the embodiment. In an implementation, the thin-film forming source may include an organic solvent or a nucleophilic reagent in addition to the molybdenum compound according to the embodiments.

A CVD process or an ALD process may be used to form the molybdenum-containing film according to the process P20 of FIG. 1. The thin-film forming source including the molybdenum compound according to the embodiment may be suitably used for chemical deposition processes, such as a CVD process or an ALD process.

In an implementation, the thin-film forming source may be used in the CVD process, and a composition of the thin-film forming source may be selected according to a method of transporting the thin-film forming source. A gas transporting method or a liquid transporting method may be used as the transporting method. When the gas transporting method is used, the thin-film forming source may be vaporized by heating and/or depressurizing in a storage container (hereinafter, referred to as a "source container") in which the thin-film forming source is stored, to generate vapor. The vapor may be introduced together with a carrier gas (e.g., argon, nitrogen, and helium) used as needed into a chamber (hereinafter, referred to as a "deposition reactor") in which a substrate is loaded. When the liquid transporting method is used, a thin-film forming source may be conveyed in a liquid state or a solution state to a vaporizer and heated and/or depressurized and vaporized in the vaporizer to generate vapor, and the vapor may be introduced into the chamber.

When the gas transporting method is used to form the molybdenum-containing film according to the process P20 of FIG. 1, the molybdenum compound itself represented by General Formula (I) may be used as a thin-film forming source. When the liquid transporting method is used to form the molybdenum-containing film according to the process P20 of FIG. 1, the molybdenum compound itself represented by General Formula (I) or a solution in which the molybdenum compound of General Formula (I) is dissolved in an organic solvent may be used as the thin-film forming source. The thin-film forming source may further include another precursor, a nucleophilic reagent, or the like.

In an implementation, a multi-component CVD process may be used to form a molybdenum-containing film in the method of manufacturing the IC device, according to the embodiment. The multi-component CVD process may be performed by using a method (hereinafter, referred to as a "single source method") of independently vaporizing and supplying respective components of a thin-film forming source to be used in a CVD process or a method (hereinafter, referred to as a "cocktail source method") of vaporizing and supplying a source mixture obtained by previously mixing multi-component sources in a desired composition. In an implementation, the cocktail source method may be used, and a mixture containing the molybdenum compound according to the embodiment and another precursor or a mixed solution obtained by dissolving the mixture in an organic solvent may be used as the thin-film forming source in a CVD process. The mixture or the mixed solution may further include a nucleophilic reagent.

The organic solvent may be a suitable organic solvent. In an implementation, the organic solvent may include, e.g., acetate esters such as ethyl acetate, n-butyl acetate, and methoxyethyl acetate; ethers such as tetrahydrofuran, tetrahydropyran, ethylene glycol dimethyl ether, diethylene glycol dimethyl ether, triethylene glycol dimethyl ether, dibutyl ether, and dioxane; ketones such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons such as hexane, cyclohexane, methylcyclohexane, dimethylcyclohexane, ethylcyclohexane, heptane, octane, toluene, and xylene; hydrocarbons having a cyano group such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; or lutidine. The above-described organic solvents may be used alone or in a mixture of at least two kinds thereof considering the relationships among solubilities, use temperatures, boiling points, and ignition points of solutes.

In an implementation, the organic solvent may be included in the thin-film forming source including the molybdenum compound according to the embodiment, and a total amount of the molybdenum compound according to the embodiment and the other precursor may range from about 0.01 mol/L to about 2.0 mol/L, e.g., about 0.05 mol/L to about 1.0 mol/L, in the organic solvent. Here, the total amount refers to the amount of the molybdenum compound according to the embodiment when the thin-film forming source does not include a metal compound and a semimetal compound other than the molybdenum compound according to the embodiment, and refers to the sum of amounts of the molybdenum compound according to the embodiment and another precursor when the thin-film forming source includes the molybdenum compound according to the embodiment and another metal compound or a semimetal compound (i.e., the other precursor).

In the method of manufacturing the IC device, according to the embodiment, a multi-component CVD process may be used to form the molybdenum-containing film, a kind of another precursor that may be used together with the molybdenum compound according to the embodiment may be a suitable precursor that may be used as thin-film forming source.

In an implementation, the other precursor that may be used to form a molybdenum-containing film in the method of manufacturing the IC device, according to the embodiment, may include, e.g., a compound of at least one organic coordination compound such as an alcohol compound, a glycol compound, a $\beta$-diketone compound, a cyclopentadiene compound, and an organic amine compound, and any one selected out of silicon and a metal.

The other precursor may include, e.g., lithium (Li), sodium (Na), potassium (K), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), tungsten (W), manganese (Mn), iron (Fe), osmium (Os), ruthenium (Ru), cobalt (Co), rhodium (Rh), iridium (Ir), nickel (Ni), palladium (Pd), platinum (Pt), copper (Cu), silver (Ag), gold (Au), zinc (Zn), aluminum (Al), gallium (Ga), indium (In), germanium (Ge), tin (Sn), lead (Pb), antimony (Sb), bismuth (Bi), radium (Ra), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

An alcohol compound that may be used as the organic coordination compound of the other precursor may include, e.g., alkyl-alcohols such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether-alcohols such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylaminoalcohols such as dimethyl amino ethanol, ethyl methyl amino ethanol, diethyl amino ethanol, dimethyl amino-2-pentanol, ethyl methyl amino-2-pentanol, dimethyl amino-2-methyl-2-pentanol, ethyl methyl amino-2-methyl-2-pentanol, or diethyl amino-2-methyl-2-pentanol.

A glycol compound that may be used as the organic coordination compound of the other precursor may include, e.g., 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, or 2,4-dimethyl-2,4-pentanediol.

A $\beta$-diketone compound that may be used as the organic coordination compound of the other precursor may include, e.g., alkyl-substituted $\beta$-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl $\beta$-diketones such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted $\beta$-diketones such as 1,1,5,5-tetramethyl-1-methoxyhexane-2,4-dione, 2,2,6,6-tetramethyl-1-methoxyheptane-3,5-dione, or 2,2,6,6-tetramethyl-1-(2-methoxyethoxy)heptane-3,5-dione.

A cyclopentadiene compound that may be used as the organic coordination compound of the other precursor may include, e.g., cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, or tetramethylcyclopentadiene.

An organic amine compound that may be used as the organic coordination compound of the other precursor may include, e.g., methylamine, ethylamine, propylamine, isopropylamine, butyl amine, sec-butyl amine, tert-butyl amine, isobutyl amine, dimethylamine, diethylamine, dipropylamine, diisopropylamine, ethylmethylamine, propylmethylamine, or isopropylmethylamine.

The other precursor may be a suitable material, and a suitable method may be used to prepare the other precursor. In an implementation, when an alcohol compound is used as an organic ligand, a precursor may be prepared by causing a reaction of an inorganic salt of the above-described element or a hydrate thereof with an alkali metal alkoxide of the corresponding alcohol compound. Here, the inorganic salt of the above-described element or the hydrate thereof may include, e.g., a metal halide or a metal nitrate. The alkali metal alkoxide may include, e.g., sodium alkoxide, lithium alkoxide, or potassium alkoxide.

When the single source method is used, the other precursor may include a compound that is similar in thermal and/or oxidative decomposition behavior to a molybdenum compound according to the embodiment. When a cocktail source method is used, the other precursor may include a material, which is similar in thermal and/or oxidative decomposition behavior to the molybdenum compound according to the embodiment, and may not deteriorate due to a chemical reaction when mixed with the molybdenum compound according to the embodiment.

In an implementation, the thin-film forming source that may be used to form the molybdenum-containing film in the method of manufacturing the IC device, according to the embodiment, may include a nucleophilic reagent to give stability to the molybdenum compound according to the embodiment and the other precursor. The nucleophilic reagent may include, e.g., ethylene glycol ethers such as glyme, diglyme, triglyme, and tetraglyme; crown ethers such as 18-crown-6, dicyclohexyl-18-crown-6, 24-crown-8, dicyclohexyl-24-crown-8, and dibenzo-24-crown-8; polyamines such as ethylene diamine, N,N'-tetramethylethyl diamine, diethylene triamine, triethylene teramine, tetraethylene pentamine, pentaethylene hexamine, 1,1,4,7,7-pentamethyldiethylene triamine, 1,1,4,7,10,10-hexamethyltriethylene tetramine, and triethoxytriethylene amine; cyclic polyamines such as cyclam and cyclen; heterocyclic compounds such as pyridine, pyrrolidine, piperidine, morpholine, N-methyl pyrrolidine, N-methyl piperidine, N-methyl morpholine, tetrahydrofurane, tetrahydropyran, 1,4-dioxane, oxazole, thiazole, and oxathiolane; or β-diketones such as acetylacetone, 2,4-hexanedione, 2,4-heptanedione, 3,5-heptanedione, and dipivaloylmethane. The nucleophilic reagent may be used in the range of about 0.1 mol to about 10 mol, e.g., about 1 mol to about 4 mol, based on 1 mol of the total amount of the precursor.

In the thin-film forming source used to form the molybdenum-containing film by using the method of manufacturing the IC device, according to the embodiment, amounts of an impurity metal component, impurity halogen (e.g., impurity chlorine), and an impurity organic material may be suppressed as much as possible. In an implementation, one type of metal may be included as the impurity metal component in the thin-film forming source in an amount of about 100 ppb or less. In an implementation, one type of metal may be included as the impurity metal component in the thin-film forming source in an amount of about 10 ppb or less. In an implementation, the total amount of impurity metals may be included in the thin-film forming source in an amount of about 1 ppm or less, e.g., about 100 ppb or less. In an implementation, when a molybdenum-containing film included in a gate insulating film, a gate conductive film, or a barrier film, which constitutes a large-scale integration (LSI) device, is formed, the contents of an alkali metal element and an alkali earth metal element, which affect the electrical characteristics of a resultant thin film, may be minimized. In an implementation, the impurity halogen component may be included in the thin-film forming source in an amount of about 100 ppm or less, e.g., about 10 ppm or less or about 1 ppm or less.

The impurity organic component may be included in the thin-film forming source in an amount of about 500 ppm or less, e.g., about 50 ppm or less or about 10 ppm or less, based on the total amount of the thin-film forming source.

In the thin-film forming source, moisture may cause particles in the thin-film forming source or cause particles during a thin-film forming process. Accordingly, the moisture of each of the precursor, the organic solvent, and the nucleophilic reagent may be previously removed before use thereof. A moisture content of each of the precursor, the organic solvent, and the nucleophilic reagent may be about 10 ppm or less, e.g., about 1 ppm or less.

When the molybdenum-containing film is formed by using the method of manufacturing the IC device, according to the embodiment, content of particles in the thin-film forming source may be minimized to reduce the contamination of the molybdenum-containing film to be formed with particles. In an implementation, when particles are measured in a liquid state by using a light-scattering-type particle detector, the number of particles having a size of more than about 0.3 m may be adjusted to 100 or less in 1 ml of a liquid. In an implementation, the number of particles having a size of more than about 0.2 m may be adjusted to 1,000 or less, e.g., 100 or less, in 1 ml of a liquid.

In the process P20 of FIG. 1, the formation of the molybdenum-containing film using the thin-film forming source may include a process of vaporizing the thin-film forming source, introducing the vaporized thin-film forming source into the deposition reactor in which the substrate is loaded, and depositing the thin-film forming source on the surface of the substrate to form a precursor thin film on the substrate and a process of causing a reaction of the precursor thin film with a reactive gas to form the molybdenum-containing film including molybdenum atoms on the surface of the substrate.

To vaporize the thin-film forming source and introduce the vaporized thin-film forming source into the deposition reactor, the liquid transporting method, the liquid transporting method, the single source method, or the cocktail source method, which is described above, or the like may be used.

The reactive gas may be a gas that reacts with the precursor thin film. In an implementation, the reactive gas may include an oxidizing gas, a reducing gas, or a nitriding gas.

The oxidizing gas may include, e.g., $O_2$, $O_3$, plasma $O_2$, $H_2O$, $NO_2$, NO, $N_2O$ (nitrous oxide), $CO_2$, $H_2O_2$, HCOOH, $CH_3COOH$, $(CH_3CO)_2O$, or a combination thereof.

The reducing gas may include, e.g., $H_2$.

The nitriding gas may include, e.g., $NH_3$, $N_2$ plasma, a mono-alkyl amine, a di-alkylamine, a tri-alkylamine, an organic amine compound, a hydrazine compound, or a combination thereof.

When a molybdenum oxide film is formed in the process P20 of FIG. 1, the oxidizing gas may be used as the reactive gas. When a molybdenum nitride film is formed in the process P20 of FIG. 1, the nitriding gas may be used as the reactive gas.

In an implementation, in the process P20 of FIG. 1, the molybdenum-containing film may be formed by using a thermal CVD process of forming a thin film by reacting a source gas including the molybdenum compound according to the embodiment or both the source gas and a reactive gas due to only heat, a plasma CVD process using heat and plasma, a photo-CVD process using heat and light, a photo-plasma CVD process using heat, light, and plasma, or an ALD process.

The molybdenum compound according to the embodiment may react with the reactive gas even at a relatively low temperature. In an implementation, a gas containing hydrogen, ammonia, ozone, or vapor may be used as the reactive gas, and thus, the productivity of the molybdenum-containing film may be improved. In an implementation, when ozone or vapor is used as the oxidizing gas, the molybdenum compound according to the embodiment may react with the oxidizing gas even at a relatively low temperature. When the molybdenum oxide film is formed by an ALD process, a thickness of the molybdenum oxide film, which may be obtained per cycle, may be relatively great. Thus, productivity may be improved during the formation of the molybdenum oxide film.

In the process of forming the molybdenum-containing film according to the process P20 of FIG. 1, a temperature and a pressure may be controlled within appropriate ranges when vapor is formed by vaporizing the thin-film forming source described above. In example embodiments, the process of vaporizing the thin-film forming source may be performed in a source container or performed in a vaporizer. The process of vaporizing the thin-film forming source may be performed at a temperature of about 0° C. to about 200° C. When the thin-film forming source is vaporized, inner pressure of the source container or the vaporizer may be about 1 Pa to about 10,000 Pa.

When the molybdenum-containing film is formed according to the process P20 of FIG. 1, a reaction temperature (or a substrate temperature), reaction pressure, a deposition rate, or the like may be appropriately selected according to a desired thickness and type of a molybdenum thin film. The reaction temperature may be a temperature at which the thin-film forming source may sufficiently react. In an implementation, the reaction temperature may be a temperature of about 100° C. or higher, e.g., about 150° C. to about 400° C.

When the process of forming the molybdenum-containing film according to the process P20 of FIG. 1 is performed using an ALD process, a film thickness of the molybdenum-containing film may be controlled by adjusting the number of cycles of the ALD process. The formation of the molybdenum-containing film on the substrate using the ALD process may include a source gas introduction process in which vapor formed by vaporizing a thin-film forming source including the molybdenum compound according to the embodiment is introduced into the deposition reactor, a precursor thin film forming process in which a precursor thin film is formed on the surface of the substrate by using the vapor, an exhaust process in which unreacted source gases remaining on the substrate are exhausted from the reaction space, and a process in which the precursor thin film is chemically reacted with a reactive gas to form the molybdenum-containing film on the surface of the substrate.

Figure 2:
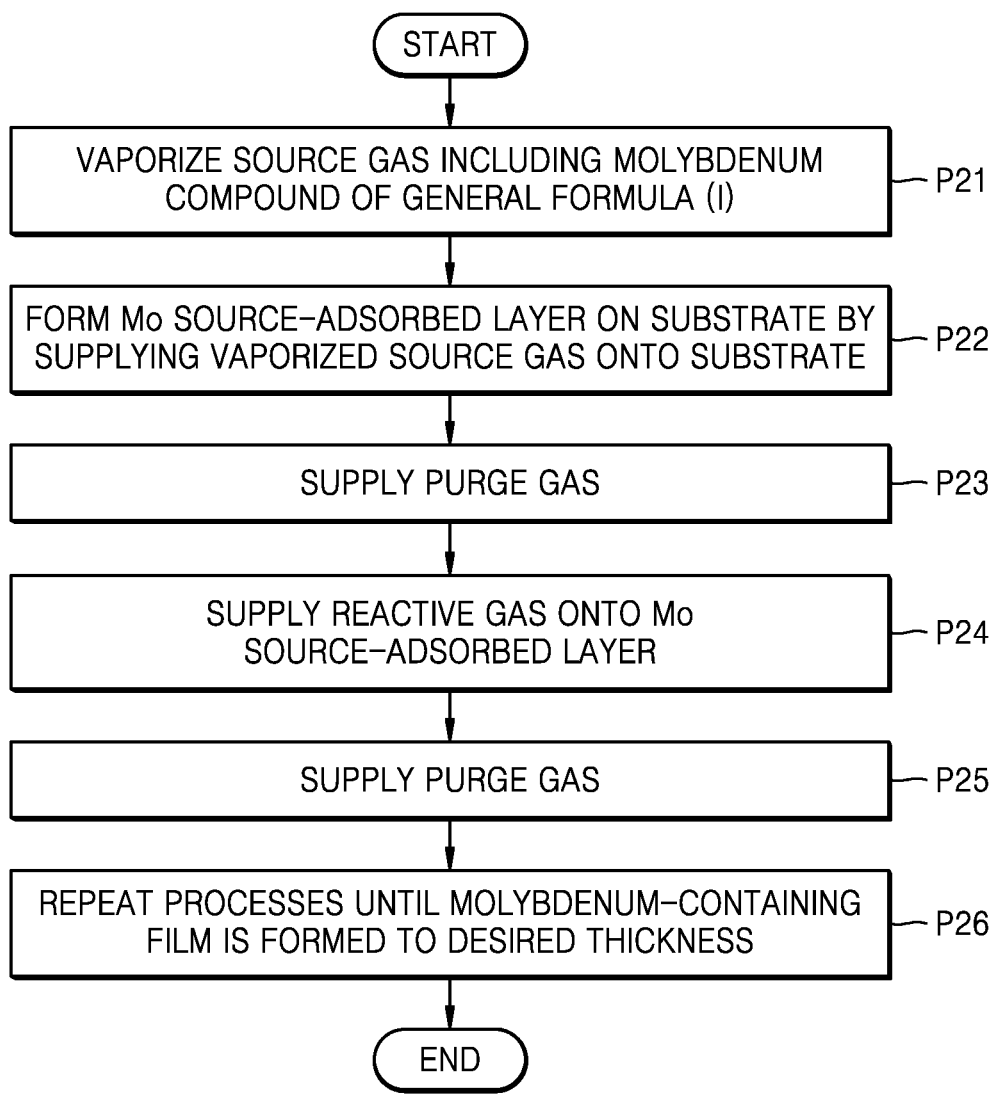
FIG. 2 is a detailed flowchart of a method of forming a molybdenum-containing film by using a method of manufacturing an IC device, according to example embodiments.

FIG. 2 is a detailed flowchart of a method of forming a molybdenum-containing film by using a method of manufacturing an IC device, according to example embodiments. A method of forming the molybdenum-containing film by using an ALD process according to the process P20 of FIG. 1 will be described with reference to FIG. 2.

Referring to FIG. 2, in a process P21, a source gas including a molybdenum compound having a structure of General Formula (I) may be vaporized.

In an implementation, the source gas may include the thin-film forming source described above. The process of vaporizing the source gas may be performed at a temperature of about 0° C. to about 200° C. When the source gas is vaporized, inner pressure of a source container or a vaporizer may range from about 1 Pa to about 10,000 Pa.

In a process P22, the source gas vaporized according to the process P21 may be supplied onto the substrate, and thus, a Mo source-adsorbed layer may be formed on the substrate.

By supplying the vaporized source gas onto the substrate, an adsorbed layer including a chemisorbed layer and a physisorbed layer of the vaporized source gas may be formed on the substrate.

In a process P23, unnecessary by-products remaining on the substrate may be removed by supplying a purge gas onto the substrate.

In an implementation, an inert gas, e.g., argon (Ar), helium (He), or neon (Ne), or nitrogen ($N_2$) gas may be used as the purge gas.

In an implementation, instead of the purge gas, a reaction space in which the substrate may be loaded may be exhausted by reducing pressure of the reaction space. In this case, to reduce the pressure of the reaction chamber, the reaction space may be maintained under pressure of about 0.01 Pa to about 300 Pa, e.g., about 0.01 Pa to about 100 Pa.

In an implementation, a process of heating the substrate on which the Mo source-adsorbed layer is formed or a process of annealing a reaction chamber containing the substrate may be further performed. The annealing process may be performed at room temperature to a temperature of about 500° C., e.g., at a temperature of about 50° C. to about 400° C.

In a process P24, a reactive gas may be supplied onto the Mo source-adsorbed layer formed on the substrate, and thus, a molybdenum-containing film may be formed on an atomic level.

In an implementation, when a molybdenum oxide film is formed on the substrate, the reactive gas may be an oxidizing gas, e.g., $O_2$, $O_3$, plasma $O_2$, $H_2O$, $NO_2$, NO, $N_2O$ (nitrous oxide), $CO_2$, $H_2O_2$, HCOOH, $CH_3COOH$, $(CH_3CO)_2O$, or a combination thereof.

In an implementation, when a molybdenum nitride film is formed on the substrate, the reactive gas may include, e.g., $NH_3$, $N_2$ plasma, a mono-alkyl amine, a adi-alkylamine, tri-alkylamine, an organic amine compound, a hydrazine compound, or a combination thereof.

In yet other example embodiments, the reactive gas may be a reducing gas, e.g., $H_2$.

In the process P24, the reaction space may be maintained at room or ambient temperature to a temperature of about 500° C., e.g., at a temperature of about 50° C. to about 400° C. or at a temperature of about 50° C. to about 200° C. such that the Mo source-adsorbed layer may sufficiently react with the reactive gas. In the process P24, pressure of the reaction space may range from about 1 Pa to about 10,000 Pa, e.g., about 10 Pa to about 1,000 Pa.

In the process P24, the reactive gas may be processed with plasma. During the plasma processing process, a radio-frequency (RF) output may range from about 0 W to about 1,500 W, e.g., about 50 W to about 600 W.

In a process P25, unnecessary by-products remaining on the substrate may be removed by supplying a purge gas onto the substrate.

In an implementation, an inert gas, e.g., argon (Ar), helium (He), or neon (Ne), or nitrogen ($N_2$) gas may be used as a purge gas.

In a process P26, the processes P21 to P25 of FIG. 2 may be repeated until the molybdenum-containing film is formed to a desired thickness.

A thin-film deposition process including a series of processes, e.g., the processes P21 to P25, may be defined as one cycle, and the cycle may be repeated a plurality of times until the molybdenum-containing film is formed to a desired thickness. In example embodiments, after the cycle is performed once, unreacted gases may be exhausted from the reaction chamber by performing an exhaust process using a purge gas, which is similar to that of the process P23 or P25, and subsequent cycles may be then performed.

The method of forming the molybdenum-containing film, which has been described with reference to FIG. 2, is merely an example, and various modifications and changes of the method may be made without departing from the spirit and scope herein.

In an implementation, to form the molybdenum-containing film on the substrate, the molybdenum compound represented by General Formula (I) and at least one of another precursor, a reactive gas, a carrier gas, and a purge gas may be simultaneously or sequentially supplied onto the substrate. Details of the other precursor, the reactive gas, the carrier gas, and the purge gas, which may be supplied onto the substrate together with the molybdenum compound represented by General Formula (I), are as described above.

In an implementation, in the process of forming the molybdenum-containing film, which has been described with reference to FIG. 2, the reactive gas may be supplied onto the substrate between the processes P21 to P25.

FIGS. 3A to 3D are schematic diagrams of configurations of deposition systems 200A, 200B, 200C, and 200D, which may be used to form a molybdenum-containing film in a method of manufacturing an IC device, according to example embodiments.

Each of the deposition systems 200A, 200B, 200C, and 200D shown in FIGS. 3A to 3D may include a fluid transmission unit 210, a thin-film formation unit 250 configured to perform a deposition process of forming a thin film on a substrate W by using a process gas supplied from a source container 212 included in the fluid transmission unit 210, and an exhaust system 270 configured to exhaust gases or by-products, which may remain after a reaction occurs in the thin-film formation unit 250.

The thin-film formation unit 250 may include a reaction chamber 254 including a susceptor 252 configured to support the substrate W. A shower head 256 may be installed at a top end unit of the inside of the reaction chamber 254. The shower head 256 may be configured to supply gas supplied from the fluid transmission unit 210 onto the substrate W.

The fluid transmission unit 210 may include an inlet line 222 configured to supply a carrier gas from the outside to the source container 212 and an outlet line 224 configured to supply a source compound contained in the source container 212 to the thin-film formation unit 250. A valve V1 and a mass flow controller (MFC) M1 may be installed at the inlet line 222, and a valve V2 and an MFC M2 may be installed at the outlet line 224. The inlet line 222 and the outlet line 224 may be connected to each other through a bypass line 226. A valve V3 may be installed at the bypass line 226. The valve V3 may operate due to pneumatic pressure by using an electric motor or another remote control unit.

The source compound supplied from the source container 212 may be supplied into the reaction chamber 254 through an inlet line 266 of the thin-film formation unit 250, which is connected to the outlet line 224 of the fluid transmission unit 210. When necessary, the source compound supplied from the source container 212 may be supplied into the reaction chamber 254 together with a carrier gas supplied through an inlet line 268. A valve V4 and an MFC M3 may be installed at the inlet line 268 into which the carrier gas is supplied.

The thin-film formation unit 250 may include an inlet line 262 configured to supply a purge gas into the reaction chamber 254 and an inlet line 264 configured to supply a reactive gas. A valve V5 and an MFC M4 may be installed at the inlet line 262, and a valve V6 and an MFC M5 may be installed at the inlet line 264.

The process gas used in the reaction chamber 254 and reaction by-products to be discarded may be exhausted to the outside through an exhaust system 270. The exhaust system 270 may include an exhaust line 272 connected to the reaction chamber 254 and a vacuum pump 274 installed at the exhaust line 272. The vacuum pump 274 may eliminate the process gas and the reaction by-products, which are exhausted from the reaction chamber 254.

A trap 276 may be installed in the exhaust line 272 at an upstream side of the vacuum pump 274. The trap 276 may trap, e.g., reaction by-products, which are generated by unreacted process gases in the reaction chamber 254, and prevent the reaction by-products from flowing into the vacuum pump 274 disposed at a downstream side.

The trap 276 installed at the exhaust line 272 may trap attachments (e.g., reaction by-products), which may occur due to a reaction between the process gases, and prevent the attachments from flowing to a downstream side of the trap 276. The trap 276 may be configured to be cooled by a cooler or a water cooling device.

In addition, a bypass line 278 and an automatic pressure controller (APC) 280 may be installed in the exhaust line 272 at an upstream side of the trap 276. A valve V7 may be installed at the bypass line 278, and a valve V8 may be installed at a portion of the exhaust line 272, which may extend parallel to the bypass line 278.

Figure 3A:
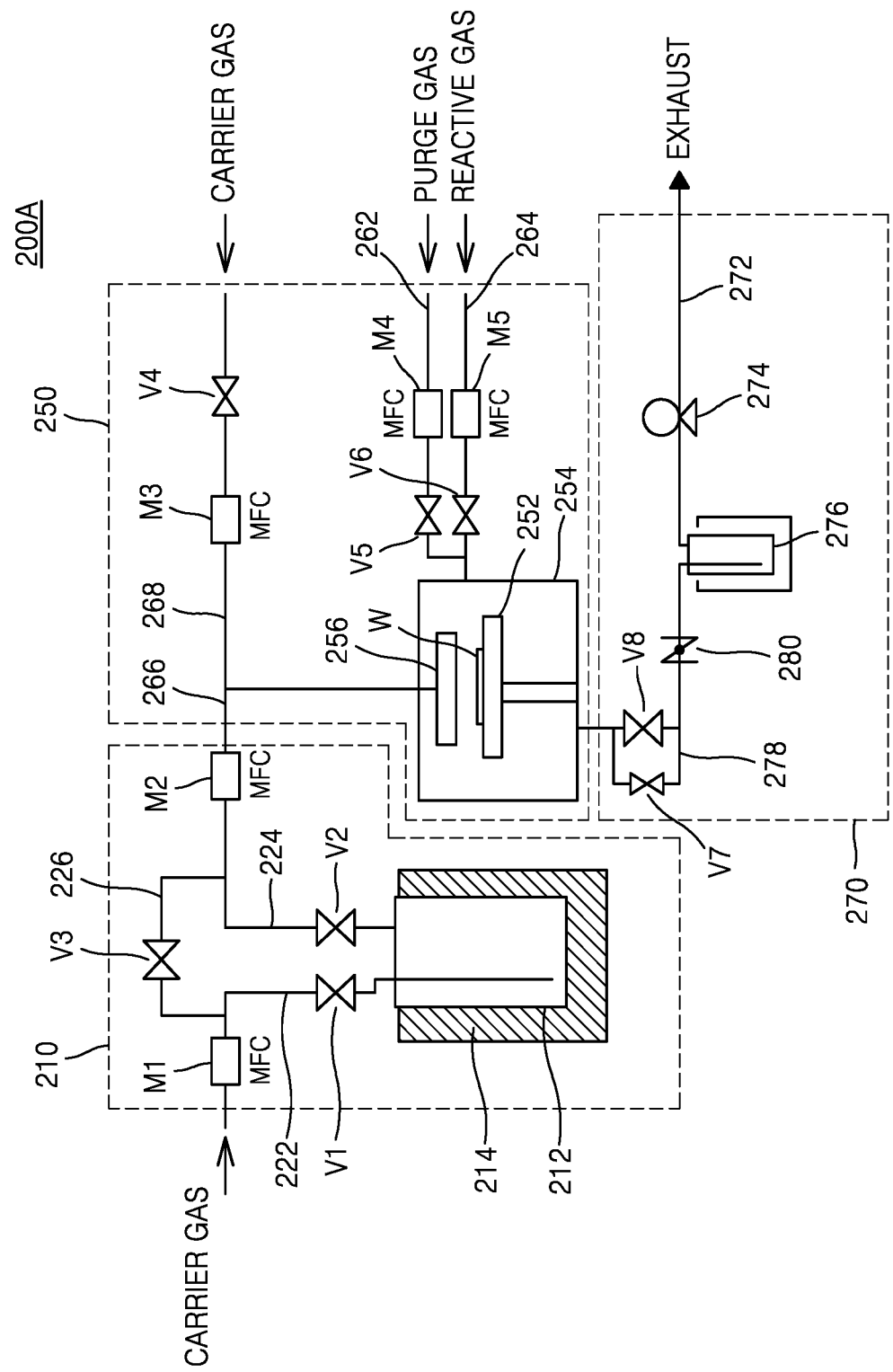
FIGS. 3A to 3D are schematic diagrams of configurations of deposition systems, which may be used to form a molybdenum-containing film in a method of manufacturing an IC device, according to example embodiments.
Figure 3B:
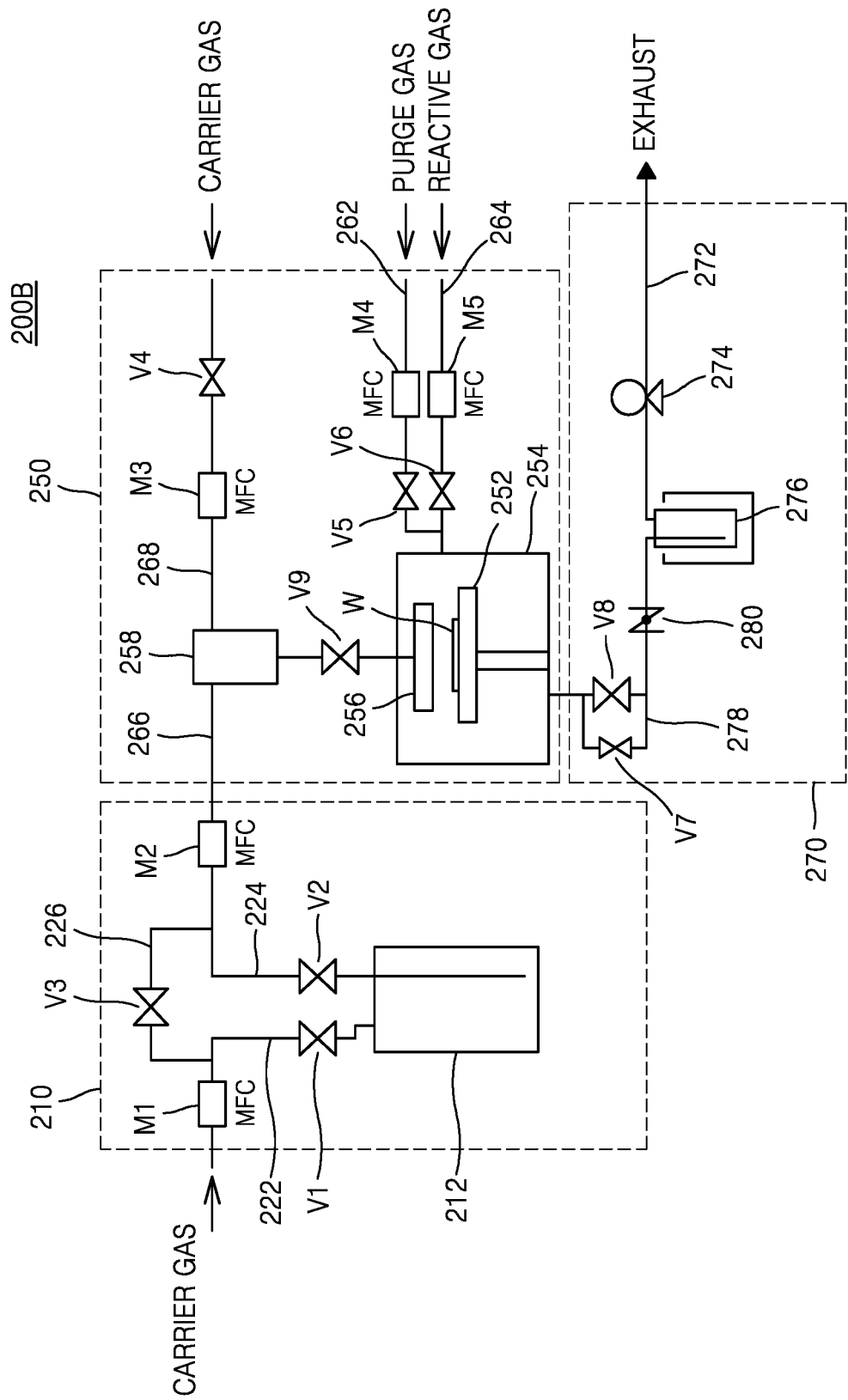

As in the deposition systems 200A and 200C shown in FIGS. 3A and 3B, a heater 214 may be installed in the source container 212. A source compound contained in the source container 212 may be maintained at a relatively high temperature by the heater 214.

Figure 3C:
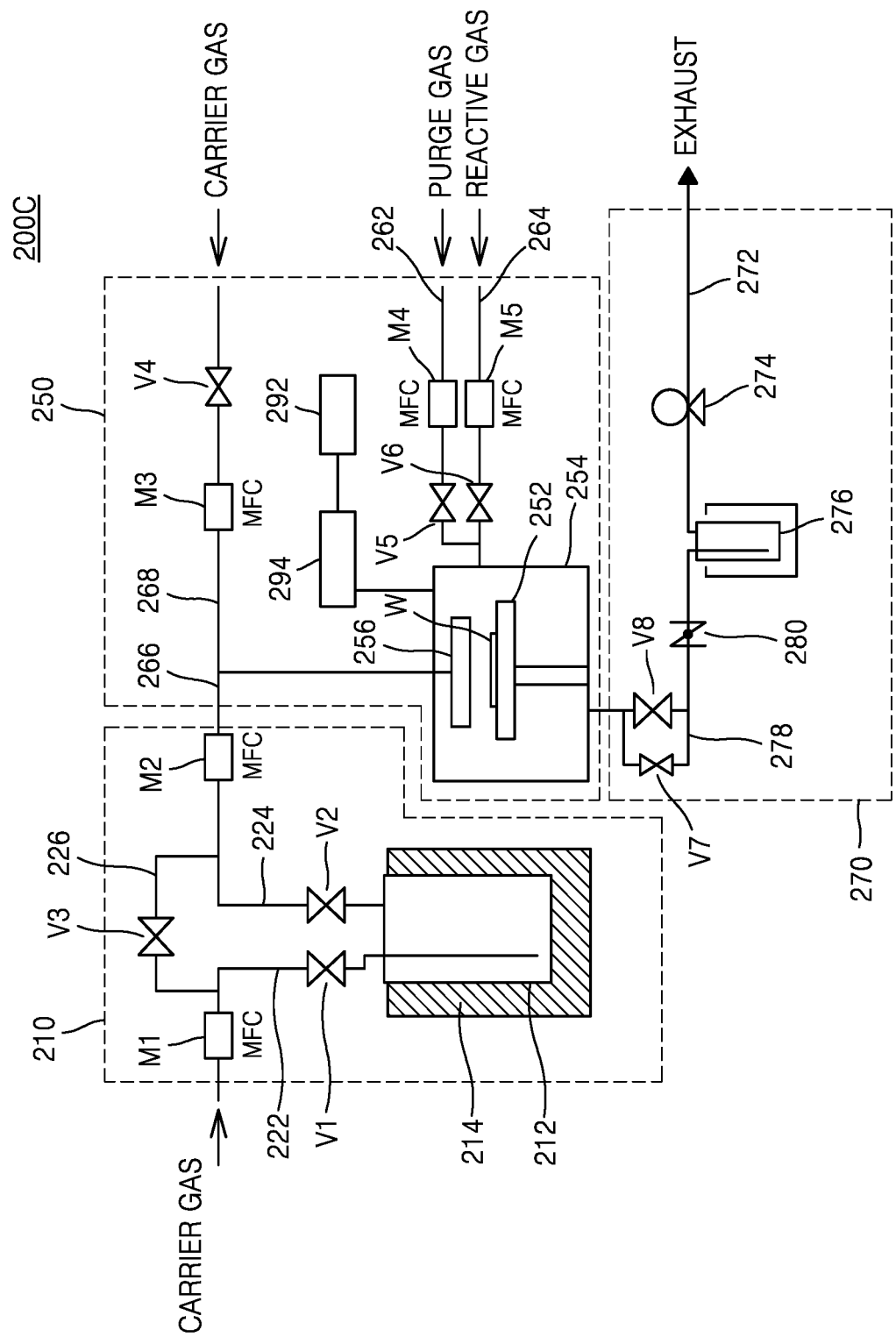
Figure 3D:
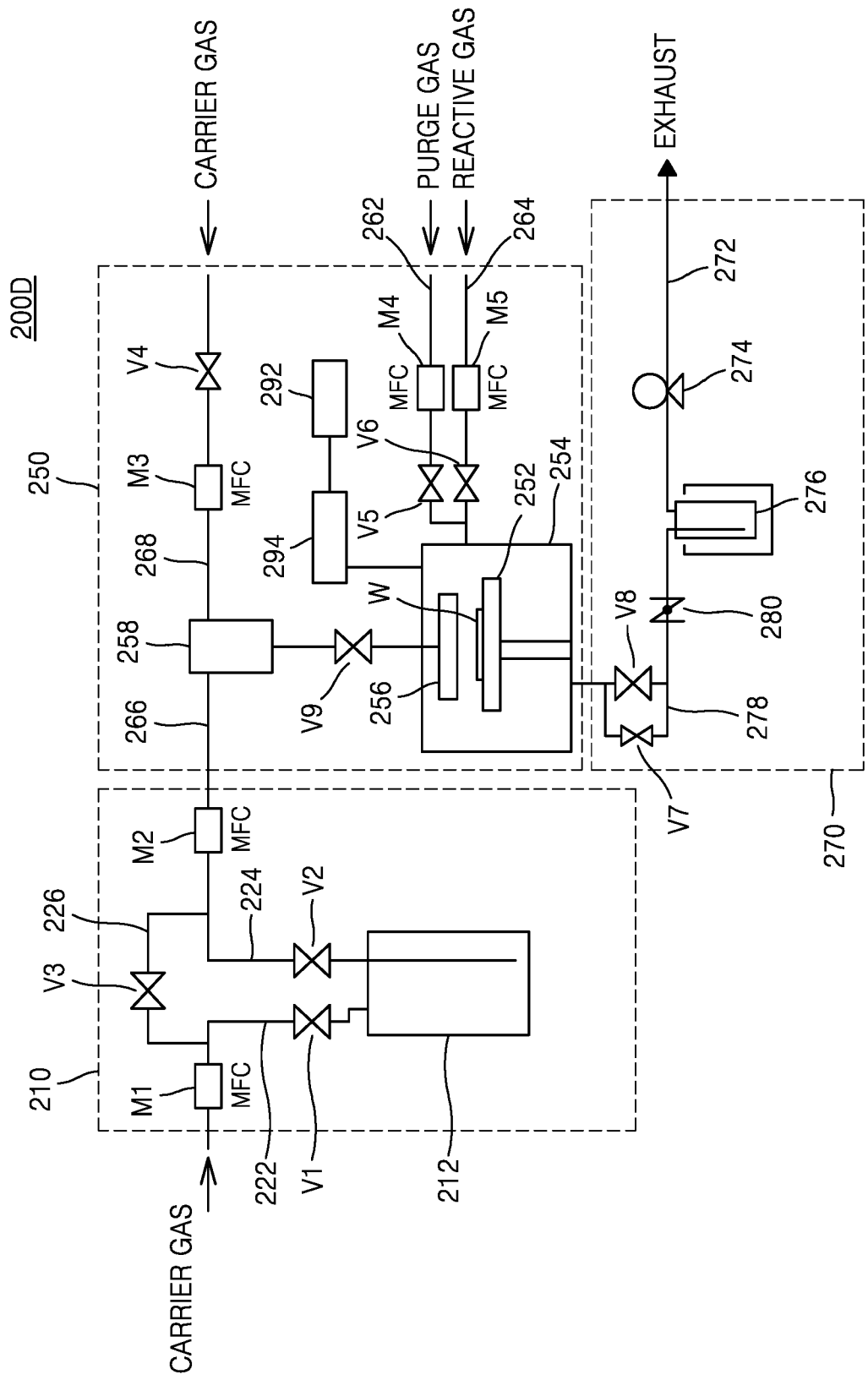

As in the deposition systems 200B and 200D shown in FIGS. 3B and 3D, a vaporizer 258 may be installed at the inlet line 266 of the thin-film formation unit 250. The vaporizer 258 may vaporize a fluid supplied in a liquid state from the fluid transmission unit 210 and supply the vaporized source compound into the reaction chamber 254. The source compound vaporized by the vaporizer 258 may be supplied into the reaction chamber 254 together with a carrier gas supplied through the inlet line 268. The supplying of the source compound into the reaction chamber 254 through the vaporizer 258 may be controlled by a valve V9.

Furthermore, as in the deposition systems 200C and 200D shown in FIGS. 3C and 3D, to generate plasma in the reaction chamber 254, the thin-film formation unit 250 may include a radio-frequency (RF) power source 292 and an RF matching system 294, which are connected to the reaction chamber 254.

In an implementation, as illustrated in FIGS. 3A to 3D, the deposition systems 200A, 200B, 200C, and 200D may include one source container 212 connected to the reaction chamber 254. In an implementation, a plurality of source containers 212 may be provided in the fluid transmission unit 210, and each of the plurality of source containers 212 may be connected to the reaction chamber 254. The number of source containers 212 connected to the reaction chamber 254 may be a suitable number.

In an implementation, the thin-film forming source containing a molybdenum compound of General Formula (I) may be vaporized by using the vaporizer 258 in any one of the deposition systems 200B and 200D shown in FIGS. 3B and 3D.

In an implementation, in the method of manufacturing the IC device, which has been described with reference to FIGS. 1 and 2, any one of the deposition systems 200A, 200B, 200C, and 200D shown in FIGS. 3A to 3D may be used to form the molybdenum-containing film on the substrate W. To form the molybdenum-containing film on the substrate W, the molybdenum compound of General Formula (I), according to the embodiment, may be transported by using various methods and supplied into a reaction space of a thin-film forming system, e.g., the reaction chamber 254 of each of the deposition systems 200A, 200B, 200C, and 200D shown in FIGS. 3A to 3D.

In an implementation, to form the molybdenum-containing film according to the method described with reference to FIGS. 1 and 2, the molybdenum-containing film may be simultaneously formed on a plurality of substrates by using a batch-type apparatus instead of a single-type apparatus, e.g., the deposition systems 200A, 200B, 200C, and 200D shown in FIGS. 3A to 3D.

When the molybdenum-containing film is formed using the method of manufacturing the IC device, according to the embodiment, conditions for forming the molybdenum-containing film may include a reaction temperature (or substrate temperature), reaction pressure, and a deposition speed.

The reaction temperature may be a temperature at which a molybdenum compound according to an embodiment, e.g., the molybdenum compound of General Formula (I), may sufficiently react. In an implementation, the reaction temperature may be a temperature of about 150° C. or higher. In an implementation, the reaction temperature may be selected in the range of about 150° C. to about 400° C. or in the range of about 200° C. to about 350° C.

The reaction pressure may be selected in the range of about 10 Pa to pressure of atmospheric pressure in the case of a thermal CVD process or a photo-CVD process, and selected in the range of about 10 Pa to about 2,000 Pa in the case of a plasma CVD process.

A deposition speed may be controlled by adjusting conditions (e.g., a vaporization temperature and vaporization pressure) for supplying a source compound, a reaction temperature, and a reaction pressure. In the method of manufacturing the IC device, according to the embodiment, a deposition speed of the molybdenum-containing film may be selected in the range of about 0.01 nm/min to about 100 nm/min, e.g., in the range of about 1 nm/min to about 50 nm/min. When the molybdenum-containing film is formed by using an ALD process, the number of cycles of the ALD process may be adjusted to control a thickness of the molybdenum-containing film.

When the molybdenum-containing film is formed using an ALD process, energy (e.g., plasma, light, and a voltage) may be applied. A time period for which the energy is applied may be variously selected. For example, the energy (e.g., plasma, light, and a voltage) may be applied when a source gas including the molybdenum compound is introduced into a reaction chamber, when the source gas is adsorbed on the substrate, when an exhaust process is performed using the purge gas, when the reactive gas is introduced into the reaction chamber, or between respective time periods for which the processes described above are performed.

In the method of manufacturing the IC device, according to the embodiment, after the molybdenum-containing film is formed using the molybdenum compound of General Formula (I), a process of annealing the molybdenum-containing film in an inert atmosphere, an oxidizing atmosphere, or a reducing atmosphere may be further performed. In an implementation, to remove a roughness from the surface of the molybdenum-containing film, a reflow process may be performed on the molybdenum-containing film as needed. Each of the annealing process and the reflow process may be performed under temperature conditions of about 200° C. to about 1,000° C., e.g., about 250° C. to about 500° C.

In an implementation, various types of molybdenum-containing films may be formed by appropriately selecting the molybdenum compound according to the embodiment, the other precursor, which may be used together with the molybdenum compound, the reactive gas, and conditions for forming thin films. In an implementation, the molybdenum-containing film using the method of manufacturing the IC device, according to the embodiment, may include a molybdenum oxide film, a molybdenum nitride film, or a molybdenum film.

When the molybdenum-containing film is formed using the method according to the embodiment, various kinds of films, such as a metal film, alloy film, a metal oxide film, and a metal nitride film, may be provided by appropriately selecting the other precursor, which may be used together with the molybdenum compound according to the embodiment, the reactive gas, and the conditions for forming the thin film. For instance, a molybdenum oxide film represented by $MoO_2$, $MoO_3$, and $Mo_2O_5$, a molybdenum nitride film represented by MoN, a Mo thin film, a composite oxide thin film of Mo, Zr, and Hf, a composite oxide thin film of Mo, Si, Zr, and Hf, a composite oxide thin film of Mo, La, and Nb, a composite oxide thin film of Mo, Si, La, and Nb, a Mo-doped metal film, a Mo-doped ferroelectric composite oxide thin film, a Mo-doped glass thin film, or the like may be provided.

The molybdenum-containing film fabricated by using the method of manufacturing the IC device, according to the embodiment, may be used for various purposes. In an implementation, the molybdenum-containing film may be used for a gate of a transistor, a metal wire, for example, a conductive barrier film used for a metal wire (e.g., copper (Cu), cobalt (Co), aluminum (Al), Ti, Ta, etc.), a dielectric film of a capacitor, a barrier metal film for liquid crystals, a member for thin-film solar cells, a member for semiconductor equipment, a nano-structure, or the like.

FIGS. 4A to 4J are cross-sectional views of stages in a method of manufacturing an IC device (refer to 300 in FIG. 4J) according to embodiments.

Figure 4A:
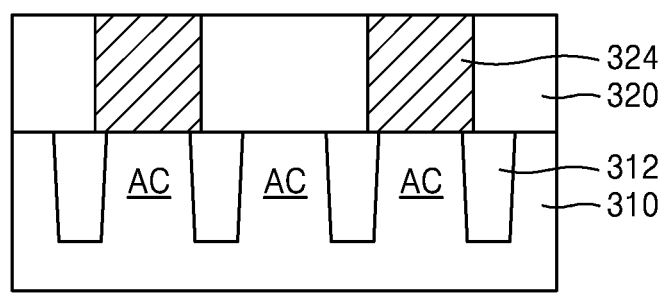
FIGS. 4A to 4J are cross-sectional views of stages in a method of manufacturing an IC device, according to embodiments.

Referring to FIG. 4A, an interlayer dielectric 320 may be formed on a substrate 310 including a plurality of active regions AC. Thereafter, a plurality of conductive regions 324 may be formed to pass through the interlayer dielectric 320 and be connected to a plurality of active regions AC.

The substrate 310 may include a semiconductor, such as silicon (Si) or germanium (Ge), or a compound semiconductor, such as silicon germanium (SiGe), silicon carbide (SiC), gallium arsenide (GaAs), indium arsenide (InAs), or indium phosphide (InP). The substrate 310 may include a conductive region, e.g., a doped well or a doped structure. The plurality of active regions AC may be defined by a plurality of device isolation regions 312 formed in the substrate 310. The device isolation regions 312 may include a silicon oxide film, a silicon nitride film, a silicon oxynitride film, or a combination thereof. The interlayer dielectric 320 may include a silicon oxide film. The plurality of conductive regions 324 may be connected to one terminal of a switching device (e.g., a field-effect transistor) formed on the substrate 310. The plurality of conductive regions 324 may include polysilicon, a metal, a conductive metal nitride, a metal silicide, or a combination thereof.

Figure 4B:
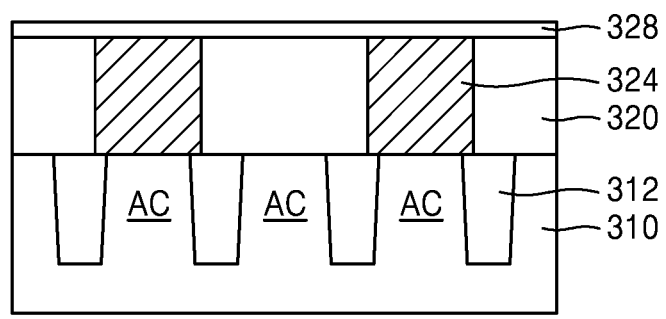

Referring to FIG. 4B, an insulating layer 328 covering the interlayer dielectric 320 and the plurality of conductive regions 324 may be formed. The insulating layer 328 may be used as an etch stop layer. The insulating layer 328 may include an insulating material having an etch selectivity with respect to the interlayer dielectric 320 and a mold film 330 (see FIG. 4C) which is formed in a subsequent process. The insulating layer 328 may include silicon nitride, silicon oxynitride, or a combination thereof.

Figure 4C:
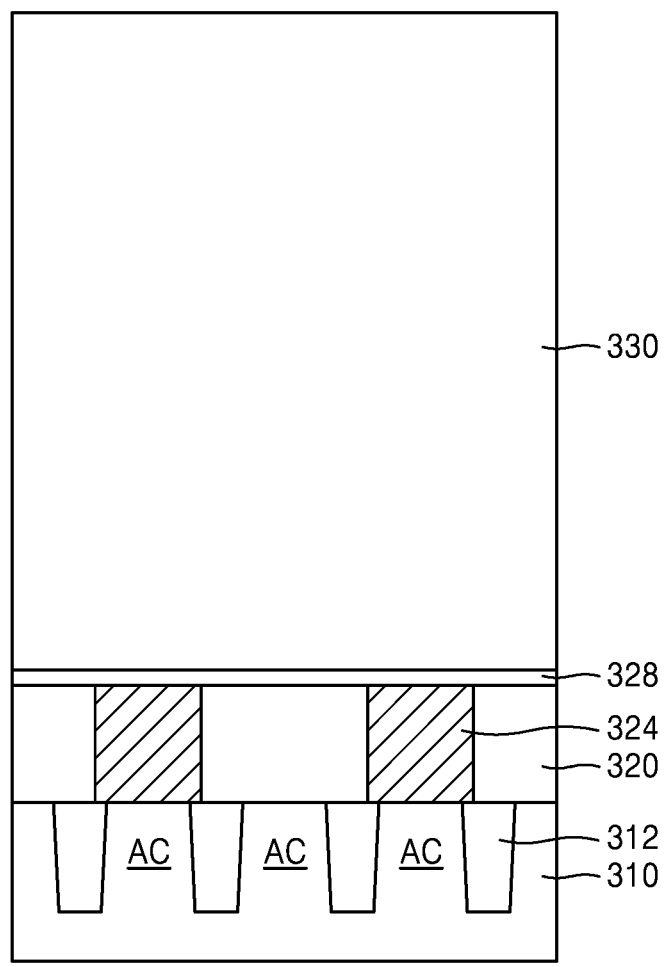

Referring to FIG. 4C, a mold film 330 may be formed on the insulating layer 328.

The mold film 330 may include an oxide film. In an implementation, the mold film 330 may include an oxide film such as borophosphosilicate glass (BPSG), phosphosilicate glass (PSG), and undoped silicate glass (USG). To form the mold film 130, a thermal CVD process or a plasma CVD process may be used. The mold film 330 may have a thickness of about 1,000 Å to about 20,000 Å. In an implementation, the mold film 330 may include a support film. The support film may include a material having an etch selectivity with respect to the mold film 330. The support film may include a material having a relatively low etch rate with respect to an etch atmosphere, e.g., with respect to an etchant including ammonium fluoride ($NH_4F$), hydrofluoric acid (F), and water when the mold film 330 is removed in a subsequent process. In an implementation, the support film may include silicon nitride, silicon carbonitride, tantalum oxide, titanium oxide, or a combination thereof.

Figure 4D:
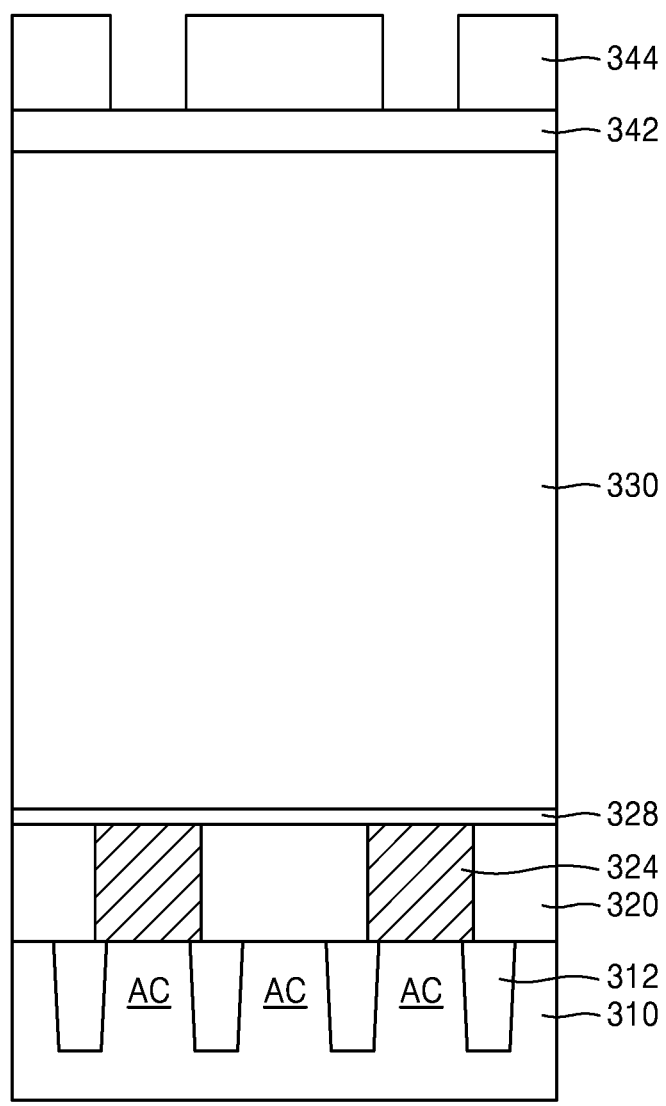

Referring to FIG. 4D, a sacrificial film 342 and a mask pattern 344 are sequentially formed on the mold film 330.

The sacrificial film 342 may include an oxide film. The mask pattern 344 may include an oxide film, a nitride film, a polysilicon film, a photoresist film, or a combination thereof. A region in which a lower electrode of a capacitor will be formed may be defined by the mask pattern 344.

Figure 4E:
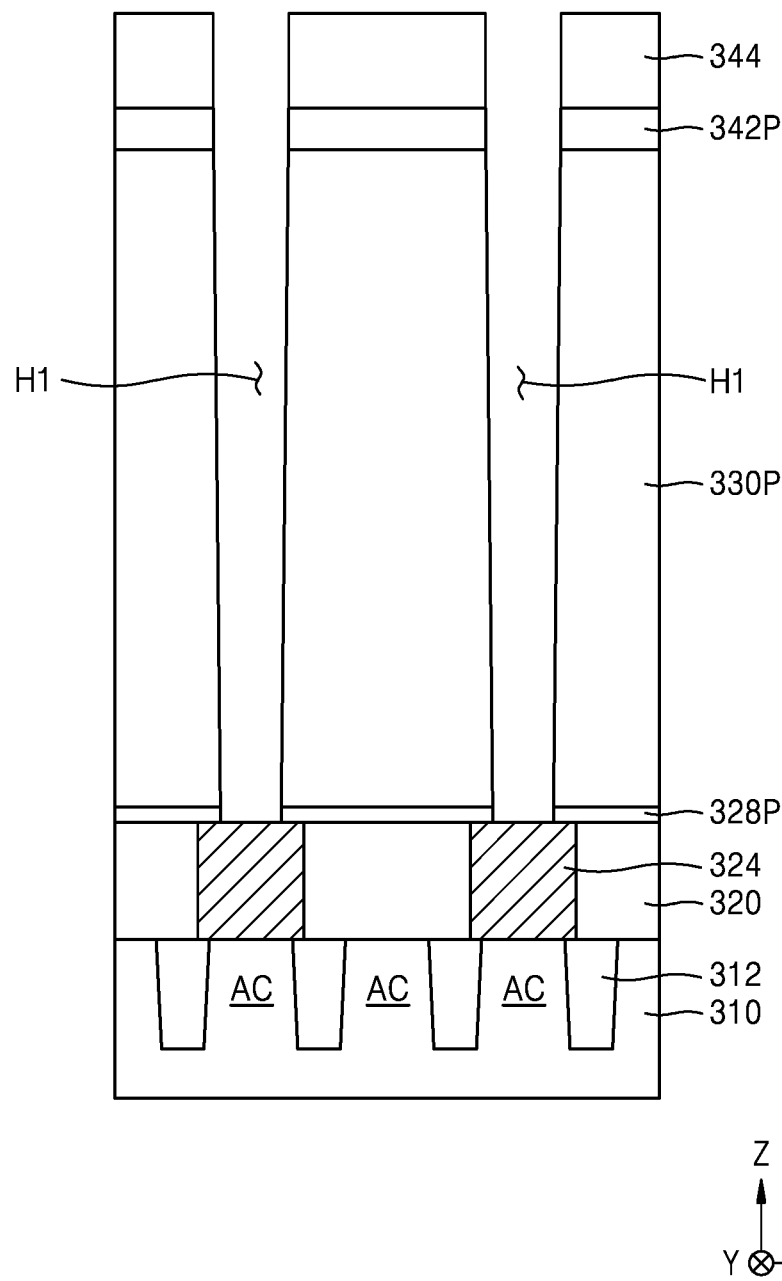

Referring to FIG. 4E, the sacrificial film 342 and the mold film 330 are dry-etched using the mask pattern 344 as an etch mask and using the insulating layer 328 as an etch stop layer, thereby forming a sacrificial pattern 342P and a mold pattern 330P, which define a plurality of holes H1. Here, the insulating layer 328 may also be etched due to over-etch, whereby an insulating pattern 328P exposing the plurality of conductive regions 324 may be formed.

Figure 4F:
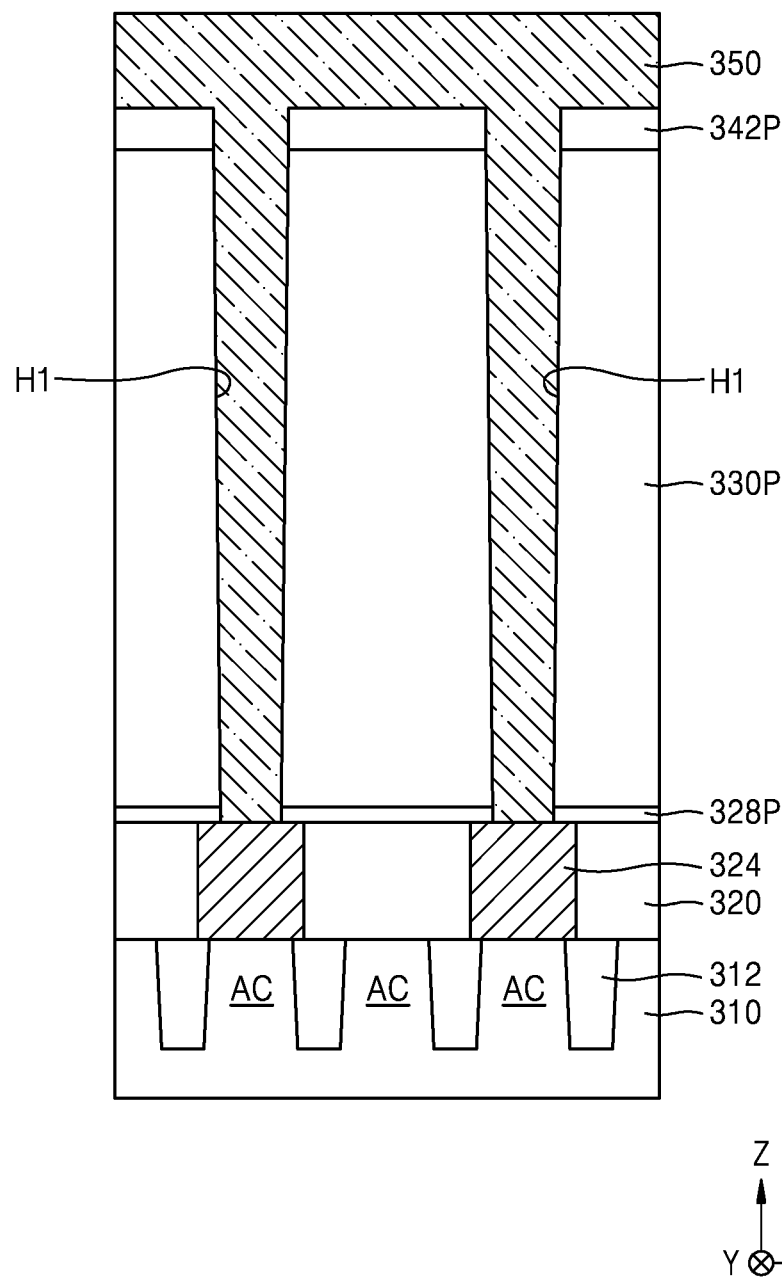

Referring to FIG. 4F, the mask pattern 344 may be removed from the resultant of FIG. 4E, followed by forming a conductive film 350 for forming lower electrodes, which fills the plurality of holes H1 and covers an exposed surface of the sacrificial pattern 342P.

The conductive film 350 for forming lower electrodes may include a doped semiconductor, a conductive metal nitride, a metal, a metal silicide, a conductive oxide, or a combination thereof. In example embodiments, the conductive film 350 for forming lower electrodes may include a doped semiconductor, a conductive metal nitride, a metal, a metal silicide, a conductive oxide, or a combination thereof. For example, the conductive film 350 for forming lower electrodes may include NbN, TiN, TiAlN, TaN, TaAlN, W, WN, Ru, $RuO_2$, Ir, $IrO_2$, Pt, PtO, SRO($SrRuO_3$), BSRO((Ba,Sr)$RuO_3$), CRO($CaRuO_3$), LSCo((La,Sr)$CoO_3$), or a combination thereof. To form the conductive film 350 for forming lower electrodes, a CVD, metal organic CVD (MOCVD), or ALD process may be used.

Figure 4G:
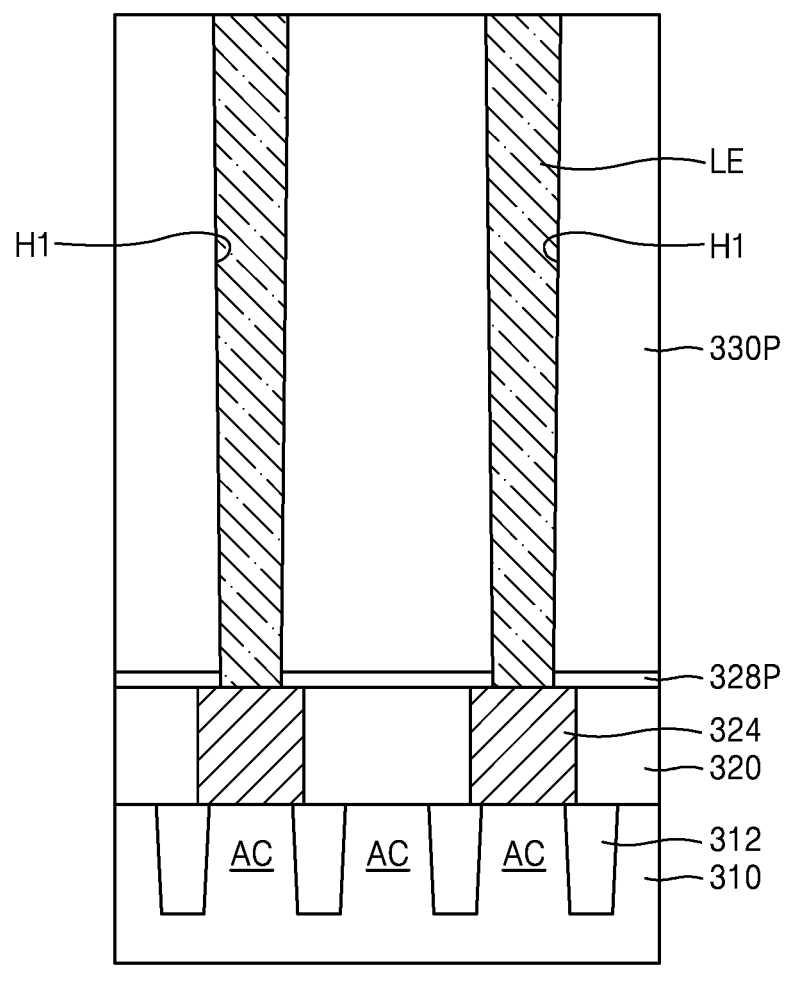

Referring to FIG. 4G, an upper side of the conductive film 350 for forming lower electrodes may be partially removed, thereby dividing the conductive film 350 for forming lower electrodes into a plurality of lower electrodes LE.

To form the plurality of lower electrodes LE, a portion of the upper side of the conductive film 350 for forming lower electrodes and the sacrificial pattern 342P (see FIG. 4F) may be removed by using an etchback or chemical mechanical polishing (CMP) process so that an upper surface of the mold pattern 330P is exposed.

Figure 4H:
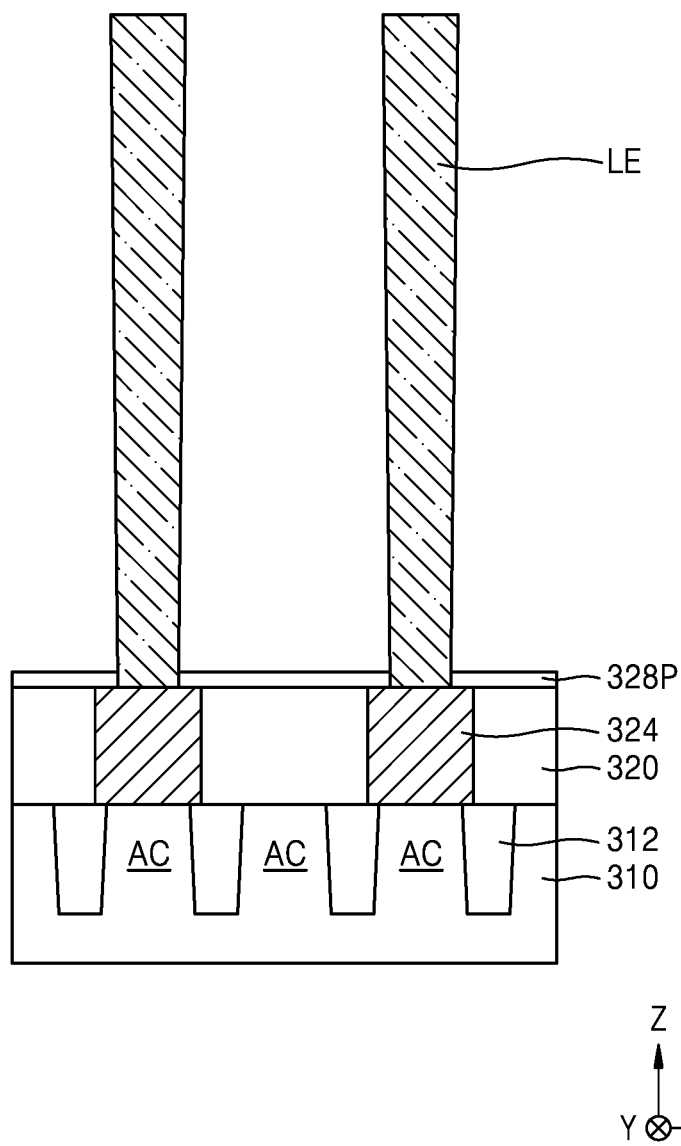

Referring to FIG. 4H, outer surfaces of the plurality of lower electrodes LE may be exposed by removing the mold pattern 330P from the resultant of FIG. 4G. The mold pattern 330P may be removed by a lift-off process using an etchant including ammonium fluoride (NH4F), hydrofluoric acid (HF), and water.

Figure 4I:
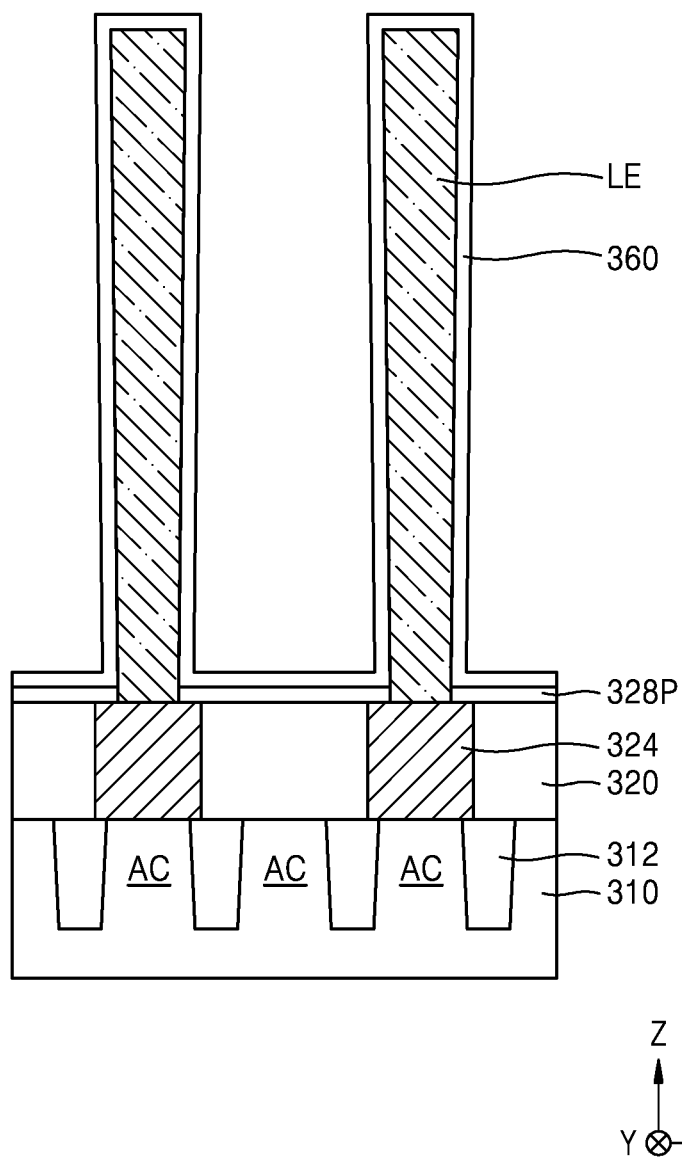

Referring to FIG. 4I, a dielectric film 360 may be formed on the plurality of lower electrodes LE.

The dielectric film 360 may conformally cover exposed surfaces of the plurality of lower electrodes LE. The dielectric film 360 may be formed by an ALD process. To form the dielectric film 360, the method described with reference to FIG. 2, may be used. Any one of the deposition systems 200B and 200D shown in FIGS. 3B and 3D may be used to form the dielectric film 360.

In an implementation, the dielectric film 360 may include a molybdenum-containing film formed using the method described with reference to FIG. 2. In an implementation, the dielectric film 360 may include a single layer of the molybdenum-containing film or include a multilayered structure including at least one molybdenum-containing film and at least one dielectric film including oxide, a metal oxide, nitride, or a combination thereof. The molybdenum-containing film may include a molybdenum oxide film including $MoO_2$, $MoO_3$, $Mo_2O_5$, or a combination thereof. In an implementation, the dielectric film 360 may include a combination of at least one molybdenum oxide film and at least one of other high-k dielectric films. The other high-k dielectric films may include hafnium oxide, hafnium oxynitride, hafnium silicon oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof. In an implementation, the dielectric film 360 may include a combination of at least one molybdenum oxide film and at least one high-k dielectric film selected out of a $ZrO_2$ film and an $Al_2O_3$ film.

In an implementation, the dielectric film 360 may have a thickness of about 50 Å to about 150 Å.

Figure 4J:
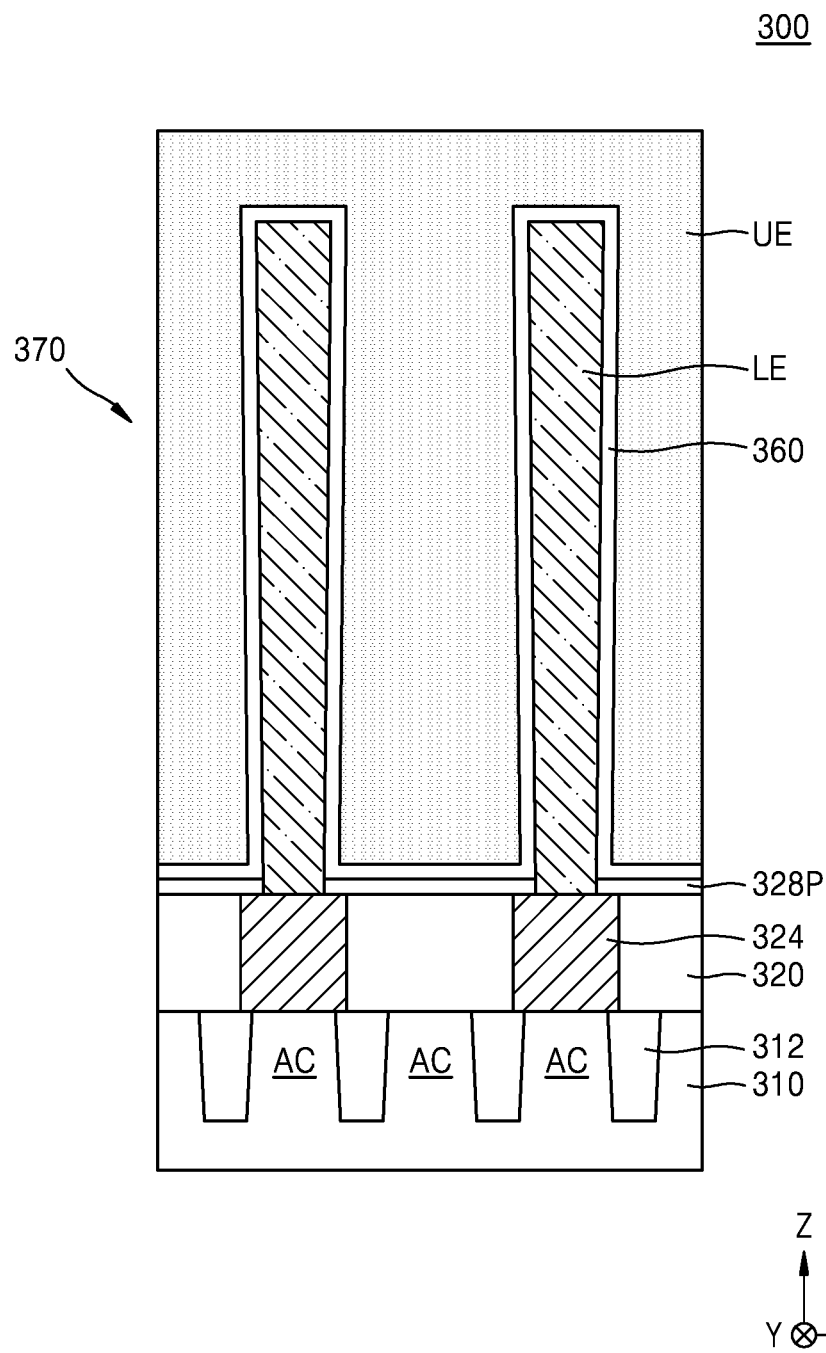

Referring to FIG. 4J, an upper electrode UE may be formed on the dielectric film 360. The lower electrode LE, the dielectric film 360, and the upper electrode UE may constitute a capacitor 370.

The upper electrode UE may include a doped semiconductor, a conductive metal nitride, a metal, a metal silicide, a conductive oxide, or a combination thereof. For instance, the upper electrode UE may include NbN, TiN, TiAlN, TaN, TaAlN, W, WN, Ru, $RuO_2$, Ir, $IrO_2$, Pt, PtO, SRO($SrRuO_3$), BSRO($Ba,Sr$)$RuO_3$), CRO($CaRuO_3$), LSCo(($La,Sr$)$CoO_3$), or a combination thereof. The upper electrode UE may be formed using a CVD process, a MOCVD process, a physical vapor deposition (PVD) process, or an ALD process.

In an implementation, as illustrated in FIGS. 4A to 4J, each of the plurality of lower electrodes LE may have a pillar shape. In an implementation, each of the plurality of lower electrodes LE may have a cup-shaped sectional structure or a cylindrical sectional structure with a blocked bottom portion.

In the IC device 300 manufactured by using the method described with reference to FIGS. 4A to 4J, the capacitor 370 may include the lower electrodes LE having a 3D electrode structure. In order to compensate for a capacitance reduction due to a reduction in design rule, an aspect ratio of the lower electrode LE having a 3D structure is increasing, and an ALD process may be used to form the dielectric film 360 having a good quality in a deep, narrow 3D space. In the method of manufacturing the IC device 300 according to the embodiments, which is described with reference to FIGS. 4A to 4J, the lower electrodes LE or the dielectric film 360 may be formed using the molybdenum compound of General Formula (I), and thus, process stability may be improved.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, specific synthesis examples of molybdenum compounds according to embodiments and methods of forming molybdenum-containing films will be described.

Example 1

Synthesis of an Intermediate (1)

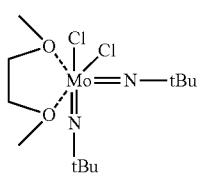

Intermediate (1)

20.0 g ($9.71 \times 10^{-2}$ mol) of sodium molybdate, 200 mL of dimethoxyethane (DME), 39.3 g ($3.88 \times 10^{-1}$ mol) of triethylamine, 14.2 g ($1.94 \times 10^{-1}$ mol) of tert-butylamine, and 85.3 g ($7.85 \times 10^{-1}$ mol) of trimethylchlorosilane were sequentially added into a 500 mL 4-neck flask, of which the inside was substituted with argon (Ar), and stirred for 18 hours by refluxing the same in an oil bath, which was heated to a temperature of about 110° C. After the completion of a reaction, the obtained resultant product was filtered and desolventized in an oil bath, which was heated to a temperature of about 80° C. under a reduced pressure to obtain 34.4 g of the intermediate (1). (yield 88.7%)

Example 2

Synthesis of an Intermediate (2)

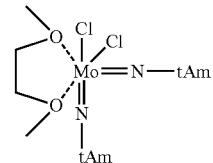

Intermediate (2)

38.3 g of the intermediate (2) was obtained using the same method as in Example 1 except that 16.9 g ($1.94 \times 10^{-1}$ mol) of tert-pentylamine was used instead of 14.2 g ($1.94 \times 10^{-1}$ mol) of tert-butylamine. (yield 92.3%)

Synthesis Example 1

Synthesis of the Compound of Formula 1

12.0 g ($9.51 \times 10^{-2}$ mol) of diisopropylcarbodiimide and 150 mL of dehydrated tetrahydrofuran (THF) were added into a 300 mL 4-neck flask, stirred, and cooled to a temperature of −30° C., followed by slowly adding 74.3 mL (1.16 mol/L) of a methyllithium/ether solution into the flask.

Subsequently, 34.4 g ($8.62 \times 10-2$ mol) of the intermediate (1) synthesized in Example 1 was mixed with 250 mL of DME, and the mixture was sufficiently stirred and slowly added dropwise into the flask at a temperature lower than about 0° C. Thereafter, the resultant product was heated to ambient temperature and stirred.

The resultant product was then desolventized under reduced pressure in an oil bath, which was heated to a temperature of about 80° C., cooled to ambient temperature, and stirred for 6 hours. Subsequently, the resultant product was desolventized under reduced pressure in the oil bath, which was heated to a temperature of about 80° C. Afterwards, the obtained product was distilled and purified at a vacuum degree of 30 Pa in the oil bath, which was heated to a temperature of about 170° C., to obtain 17.2 g of a red solid. (yield 48.1%)

The obtained red solid was confirmed to be a compound of Formula 1, which was a target compound, by 1H-NMR analysis. Results obtained by the 1H-NMR analysis of the obtained red solid are as follows.

1H-NMR (benzene-D6)

3.67 ppm (1H, multiplet), 3.39 ppm (1H, multiplet), 1.49 ppm (6H, doublet), 1.46 ppm (18H, singlet), 1.33 ppm (3H, singlet), 0.95 ppm (6H, doublet)

Synthesis Example 2

Synthesis of the Compound of Formula 2

16.3 g of a red solid was obtained using the same method as in Synthesis example 1 except that 36.7 g ($8.62 \times 10^{-2}$ mol)

of the intermediate (2) synthesized in Example 2 was used instead of 34.4 g (8.62×10$^{-2}$ mol) of the intermediate (1) synthesized in Example 1. (yield 41.1%)

The obtained red solid was confirmed to be a compound of Formula 2, which was a target compound, by 1H-NMR analysis. Results obtained by the 1H-NMR analysis of the obtained red solid are as follows.

1H-NMR (benzene-D6)

3.68 ppm (1H, multiplet), 3.38 ppm (1H, multiplet), 1.72 ppm (4H, quartet), 1.56 ppm (6H, singlet), 1.49 ppm (6H, doublet), 1.39 ppm (6H, singlet), 1.34 ppm (3H, singlet), 1.09 ppm (6H, triplet), 1.03 ppm (6H, doublet)

Synthesis Example 3

Synthesis of the Compound of Formula 3

12.0 g (9.51×10$^2$ mol) of diisopropylcarbodiimide and 150 mL of THF were added into a 300 mL 4-neck flask, stirred, and cooled to a temperature of −30° C., followed by slowly adding 74.3 mL (1.16 mol/L) of a methyllithium/ether solution thereto. The obtained product was heated to ambient temperature and stirred for 6 hours.

Subsequently, 34.4 g (8.62×10−2 mol) of the intermediate (1) synthesized in Example 1 was mixed with 250 mL of DME, and the mixture was sufficiently stirred and slowly added dropwise into the flask at a temperature of about 0° C. or lower. Thereafter, the resultant product was heated to ambient temperature and stirred.

The resultant product was then desolventized under reduced pressure in an oil bath, which was heated to a temperature of about 80° C., and cooled to ambient temperature. 150 mL of THF was added into the flask and cooled to a temperature of −30° C., followed by slowly adding 81.7 mL (1.16 mol/L) of a methyllithium/ether solution into the flask. The obtained product was heated to ambient temperature and stirred for 3 hours. The resultant product was stirred for 5 hours by refluxing the same in the oil bath, which was heated to a temperature of about 100° C. After the completion of a reaction, the obtained resultant product was desolventized in the oil bath, which was heated to a temperature of about 70° C., cooled to ambient temperature, and filtered by adding 150 mL of hexane to the flask. The obtained solution was desolventized under reduced pressure in the oil bath, which was heated to a temperature of about 70° C. Afterwards, the obtained product was distilled and purified at a vacuum degree of 30 Pa in the oil bath, which was heated to a temperature of about 130° C., to obtain 15.3 g of a reddish-brown liquid. (yield 45.0%)

The obtained reddish-brown liquid was confirmed to be a compound of Formula 3, which was a target compound, by 1H-NMR analysis. Results obtained by the 1H-NMR analysis of the obtained reddish-brown liquid are as follows.

1H-NMR (benzene-D6)

3.54 ppm (1H, multiplet), 3.47 ppm (1H, multiplet), 1.43 ppm (18H, singlet), 1.38 ppm (3H, singlet), 1.23 ppm (6H, doublet), 1.10 ppm (6H, doublet), 1.05 ppm (3H, singlet)

Synthesis Example 4

Synthesis of the Compound of Formula 4

15.3 g of a reddish-brown solid was obtained using the same method as in Synthesis example 3 except that 14.7 g (9.51×10$^{-2}$ mol) of di-tert-butylcarbodiimide was used instead of 12.0 g (9.51×10$^{-2}$ mol) of diisopropylcarbodiimide. (yield 45.0%)

The obtained reddish-brown solid was confirmed to be a compound of Formula 4, which was a target compound, by 1H-NMR analysis. Results obtained by the 1H-NMR analysis of the obtained reddish-brown solid are as follows.

1H-NMR (benzene-D6)

1.78 ppm (3H, singlet), 1.43 ppm (18H, singlet), 1.35 ppm (9H, singlet), 1.30 ppm (9H, singlet), 1.03 ppm (3H, singlet)

Synthesis Example 5

Synthesis of the Compound of Formula 5

14.7 g (9.51×10$^{-2}$ mol) of di-tert-butylcarbodiimide and 150 mL of THF were added into a 300 mL 4-neck flask, stirred, and cooled to a temperature of about −30° C., followed by slowly adding 74.3 mL (1.16 mol/L) of a methyllithium/ether solution thereto. The resultant product was heated to ambient temperature and stirred for 6 hours.

Subsequently, 34.4 g (8.62×10$^{-2}$ mol) of the intermediate (1) synthesized in Example 1 was mixed with 250 mL of DME, and the mixture was sufficiently stirred and slowly added dropwise into the flask at a temperature of about 0° C. or lower. Thereafter, the resultant product was heated to ambient temperature and stirred.

The resultant product was then desolventized under reduced pressure in an oil bath, which was heated to a temperature of about 80° C. and cooled to ambient temperature. 150 mL of THE was added thereto and cooled to a temperature of about −30° C., followed by slowly adding 89.4 mL (1.06 mol/L) of a neopentyllithium/hexane solution into the flask. The obtained product was heated to ambient temperature and stirred for 3 hours. The resultant product was stirred for 5 hours by refluxing the same in the oil bath, which was heated to a temperature of about 100° C. After the completion of a reaction, the obtained resultant product was desolventized in the oil bath, which was heated to a temperature of about 70° C., cooled to ambient temperature, and filtered by adding 150 mL of hexane into the flask. The obtained solution was desolventized under reduced pressure in the oil bath, which was heated to a temperature of about 70° C. Afterwards, the obtained product was distilled and purified at a vacuum degree of 30 Pa in the oil bath, which was heated to a temperature of about 130° C., to obtain 19.1 g of a yellow solid. (yield 52.5%)

The obtained yellow solid was confirmed to be a compound of Formula 5, which was a target compound, by 1H-NMR analysis. Results obtained by the 1H-NMR analysis of the obtained yellow solid are as follows.

1H-NMR (benzene-D6)

2.17 ppm (2H, singlet), 1.82 ppm (3H, singlet), 1.47 ppm (18H, singlet), 1.41 ppm (18H, singlet), 1.39 ppm (9H, singlet)

Synthesis Example 6

Synthesis of the Compound of Formula 6

15.3 g of a red liquid was obtained using the same method as in Synthesis example 3 except that 36.7 g (8.62×10$^{-2}$ mol) of the intermediate (2) synthesized in Example 2 was used instead of 34.4 g (8.62×10$^{-2}$ mol) of the intermediate (1) synthesized in Example 1. (yield 41.8%)

The obtained red liquid was confirmed to be a compound of Formula 6, which was a target compound, by 1H-NMR analysis. Results obtained by the 1H-NMR analysis of the obtained red liquid are as follows.

1H-NMR (benzene-D6)

3.57 ppm (1H, multiplet), 3.45 ppm (1H, multiplet), 1.67 ppm (4H, quartet), 1.47 ppm (6H, singlet), 1.43 ppm (6H, singlet), 1.38 ppm (3H, singlet), 1.24 ppm (6H, doublet), 1.10 ppm (6H, doublet), 1.07 ppm (3H, singlet), 1.03 ppm (6H, triplet)

Next, a melting point, a pyrolysis start temperature T1, and a 50% mass reduction temperature T2 (TG-DTA under reduced pressure) of each of the compounds of Formulae 1 to 6, which were obtained in Synthesis examples 1 to 6, and Comparative compounds 1 to 3 were estimated and shown in Table 1.

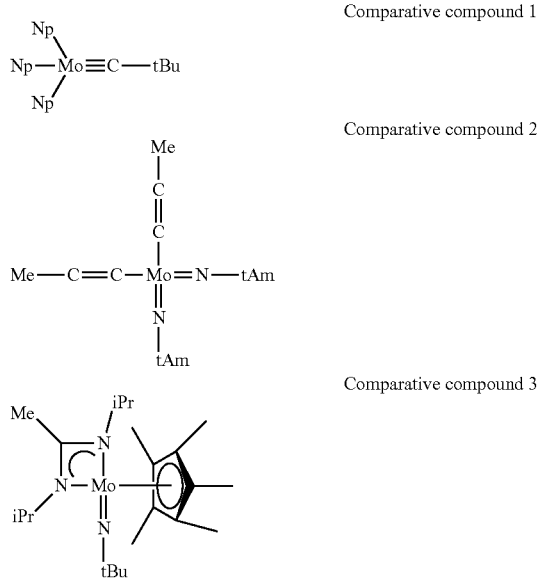

Comparative compound 1

Comparative compound 2

Comparative compound 3

Estimation of Melting Points of Compounds

Results obtained by visually observing phases of the compounds of Formulae 1 to 6, which were obtained in Synthesis examples 1 to 6, are shown in Table 1 along with results of each of comparative compounds 1 to 3. Table 1 also shows melting points of solid compounds, which were measured using a melting point measuring system.

Estimation of Pyrolysis Start Temperatures T1 of Compounds

Each of the compounds of Formulae 1 to 6, which were obtained in Synthesis examples 1 to 6, and the comparative compounds 1 to 3 was analyzed using a differential scanning calorimetry (DSC) technique at a heating rate of about 10° C./min and in a scanning temperature range of 70° C. to 500° C. A temperature at which an exothermic reaction reached a peak was defined as a pyrolysis start temperature T1, and measurement results thereof are shown in Table 1.

Estimation of TG-DTA Under Reduced Pressure

Under conditions of pressure of 10 Torr, an Ar flow rate of 100 mL/min, a heating rate of 10° C./min, and a scanning temperature range of about 30° C. to about 600° C., a 50% mass reduction temperature T2 of each of the compounds of Formulae 1 to 6, which were obtained in Synthesis examples 1 to 6, and the comparative compounds 1 to 3 was measured using a TG-DTA technique, and measurement results thereof are shown in Table 1.

TABLE 1

| Compound | Phase/Melting point (° C.) | T1 (° C.) | T2 (° C.) |
|---|---|---|---|
| Formula 1 | Solid/88 | 310 | 252 |
| Formula 2 | Solid/45 | 299 | 259 |
| Formula 3 | Liquid | 342 | 216 |
| Formula 4 | Solid/80 | 330 | 230 |
| Formula 5 | Solid/194 | 272 | 243 |
| Formula 6 | Liquid | 344 | 234 |
| Comparative compound 1 | Solid/55 | 168 | 180 |
| Comparative compound 2 | Liquid | 198 | 230 |
| Comparative compound 3 | Solid/114 | 322 | 282 |

As can be seen from the results of Table 1, each of the comparative compounds 1 to 3 was not suitable for a thin-film forming source for manufacturing an IC device due to a low vapor pressure or insufficient thermal stability thereof. In contrast, it may be seen that each of the compounds of Formulae 1 to 6, which were obtained in Synthesis examples 1 to 6, had an excellent thermal stability because the pyrolysis start temperature T1 of each of the compounds of Formula 1 to 6 ranged from about 272° C. to about 344° C. Furthermore, it may be seen that vapor was obtained at a relatively low temperature because the 50% mass reduction temperature T2 (TG-DTA under reduced pressure) of each of the compounds of Formulae 1 to 6, which were obtained in Synthesis examples 1 to 6, was relatively low (e.g., less than 260° C.). Therefore, it may be ascertained that each of the compounds of Formulae 1 to 6 obtained in Synthesis examples 1 to 6 may react with a reactive gas at a relatively low temperature. From the above-described results of Table 1, it may be seen that the molybdenum compounds according to the embodiments may be suitably used as thin-film forming sources for manufacturing IC devices.

Estimation Example 1

(1) Formation of Molybdenum-Containing Film

A molybdenum oxide film was formed on a copper (Cu) substrate by an ALD process using the compound of Formula 3 as a source. Conditions of the ALD process for forming the molybdenum oxide film were as follows.
<Conditions>
Reaction temperature (or substrate temperature): 270° C.
A reactive gas: vapor
<Process>
One cycle including a series of processes (1) to (4) was repeated 150 times under the above-described conditions.

Process (1): Vapor generated by vaporizing a source under conditions where a source container was heated to a temperature of about 100° C. and maintained under inner pressure of about 100 Pa was introduced into a chamber, and a molybdenum-containing film was deposited for about 30 seconds in the chamber, which was maintained under pressure of about 100 Pa.

Process (2): An argon (Ar) purge process was performed for about 5 seconds to remove unreacted sources from the chamber.

Process (3): A reactive gas was supplied into the chamber to cause a reaction for about 30 seconds under pressure of about 100 Pa.

Process (4): An argon purge gas was performed for about 5 seconds to remove unreacted sources from the chamber.

As a result of confirming a film composition using an X-ray photoelectron spectroscopy (XPS) technique, a molybdenum oxide film was obtained, and residual carbon was not detected in the molybdenum oxide film. A thickness of the obtained molybdenum oxide film, which was measured using an X-ray reflectivity technique, was about 7.4 nm, and a film thickness obtained per cycle was about 0.049 nm.

Estimation Example 2

(2) Formation of Molybdenum-Containing Film

A molybdenum oxide film was formed using the same method as in Estimation example 1 except that the compound of Formula 6 was used as a source instead of the compound of Formula 3.

As a result of confirming a film composition using an XPS technique, a molybdenum oxide film was obtained, and residual carbon was not detected in the molybdenum oxide film. A thickness of the obtained molybdenum oxide film, which was measured using an X-ray reflectivity technique, was about 7.0 nm, and a film thickness obtained per cycle was about 0.047 nm.

Comparative Estimation Example 1

A molybdenum oxide film was formed using the same method as in Estimation example 1 except that the comparative compound 2 was used as a source instead of the compound of Formula 3.

As a result of confirming a film composition using an XPS technique, a molybdenum oxide film was obtained. The molybdenum oxide film was of relatively low quality due to a high residual carbon content thereof. The obtained molybdenum oxide film had a thickness of about 3.4 nm, and a film thickness obtained per cycle was about 0.023 nm.

From the results of Comparative estimation example 1, it can be seen that when the molybdenum-containing film was formed using the comparative compound 2, which was a compound having a relatively low thermal stability, as a source, a good-quality molybdenum-containing film could not be obtained due to a relatively high residual carbon content thereof.

Comparative Estimation Example 2

A molybdenum oxide film was formed using the same method as in Estimation example 1 except that the comparative compound 3 was used as a source instead of the compound of Formula 3.

As a result of confirming a film composition using an XPS technique, a molybdenum oxide film was obtained, and residual carbon was not detected in the molybdenum oxide film. The obtained molybdenum oxide film had a thickness of about 2.8 nm, and a film thickness obtained per cycle was about 0.018 nm.

From the results of Comparative estimation example 2, it may be seen that when a molybdenum-containing film was formed using the comparative compound 2, which had excellent thermal stability and a low vapor pressure, as a source, productivity was reduced because a film thickness obtained for each cycle of an ALD process was relatively small.

In contrast, as may be seen from the results of Estimation examples 1 and 2, unlike in Comparative estimation examples 1 and 2, it may be seen that when the molybdenum compound according to the embodiment as a source, a molybdenum-containing film of good quality could be formed because a residual carbon content of the molybdenum-containing film was very low (e.g., below a measurable level), and productivity could be improved because a film thickness obtained per cycle was relatively great.

By way of summation and review, compounds for thin-film forming sources, which may help suppress undesired impurities during the formation of a thin film containing molybdenum, provide excellent gap-fill characteristics and step coverage characteristics even in a narrow and deep space having a high aspect ratio, and be advantageous in terms of process stability and mass productivity due to handling easiness thereof, have been considered.

One or more embodiments may provide a molybdenum compound having an amidinate ligand.

One or more embodiments may provide a molybdenum compound, which may help suppress undesired impurities in a molybdenum-containing film during the formation of the molybdenum-containing film and provide excellent thermal stability, process stability, and mass productivity.

One or more embodiments may provide a method of manufacturing an integrated circuit (IC) device, by which a molybdenum-containing film of good quality may be formed using a molybdenum compound to provide desired electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A molybdenum compound represented by the following General Formula (I):

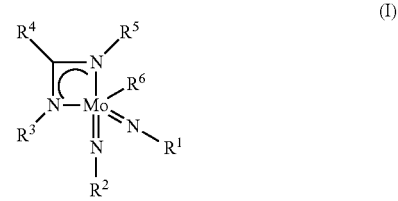

wherein $R^1$, $R^2$, $R^3$, $R^4$, $R^5$, and $R^6$ are each independently a C1 to C12 alkyl group, a C2 to C12 alkenyl group, a C2 to C12 alkynyl group, or a halogen atom.

2. The molybdenum compound as claimed in claim 1, wherein $R^1$, $R^2$, $R^3$, $R^4$, $R^5$, and $R^6$ are each independently a C1 to C8 linear alkyl group or a C1 to C8 branched alkyl group.

3. The molybdenum compound as claimed in claim 1, wherein each of $R^4$ and $R^6$ is a methyl group.

4. The molybdenum compound as claimed in claim 1, wherein $R^1$, $R^2$, $R^3$, and $R^5$ are each independently a branched alkyl group.

5. The molybdenum compound as claimed in claim 1, wherein $R^1$, $R^2$, $R^3$, and $R^5$ are each independently an isopropyl group, a sec-butyl group, a tert-butyl group, a tert-pentyl group, or a neopentyl group.

6. The molybdenum compound as claimed in claim 1, wherein at least one of $R^4$ and $R^6$ is a halogen atom.

7. The molybdenum compound as claimed in claim 1, wherein:
one of $R^4$ and $R^6$ is a halogen atom, and
the other one of $R^4$ and $R^6$ is a C1 to C8 linear alkyl group or a C1 to C8 branched alkyl group.

8. The molybdenum compound as claimed in claim 1, wherein:
at least one of $R^1$, $R^2$, $R^3$, $R^4$, $R^5$, and $R^6$ is a halogen atom, and
the halogen atom is fluorine (F) or chlorine (Cl).

9. The molybdenum compound as claimed in claim 1, wherein:
$R^1$, $R^2$, $R^3$, and $R^5$ are each independently a C1 to C8 branched alkyl group, and
$R^4$ and $R^6$ are each independently a C1 to C8 linear alkyl group or a halogen atom.

10. The molybdenum compound as claimed in claim 1, wherein the molybdenum compound is a liquid at about 20° C. to about 28° C.

11. A method of manufacturing an integrated circuit device, the method comprising forming a molybdenum-containing film on a substrate using a molybdenum compound represented by the following General Formula (I):

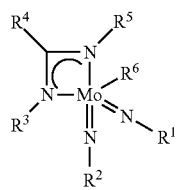

(I)

wherein $R^1$, $R^2$, $R^3$, $R^4$, $R^5$, and $R^6$ are each independently
a C1 to C12 alkyl group, a C2 to C12 alkenyl group, a C2 to C12 alkynyl group, or a halogen atom.

12. The method as claimed in claim 11, wherein the molybdenum compound is a liquid at about 20° C. to about 28° C.

13. The method as claimed in claim 11, wherein:
$R^1$, $R^2$, $R^3$, and $R^5$ are each independently a C1 to C8 branched alkyl group, and
$R^4$ and $R^6$ are each independently a C1 to C8 linear alkyl group or a halogen atom.

14. The method as claimed in claim 11, wherein forming the molybdenum-containing film includes supplying the molybdenum compound alone onto the substrate.

15. The method as claimed in claim 11, wherein forming the molybdenum-containing film includes supplying a multi-component source onto the substrate, the multi-component source including a mixture of the molybdenum compound and at least one of a precursor compound, a reactive gas, and an organic solvent, the precursor compound including a metal that is different from molybdenum.

16. The method as claimed in claim 15, wherein the reactive gas includes $NH_3$, $N_2$ plasma, a mono-alkyl amine, a di-alkylamine, a tri-alkylamine, an organic amine compound, a hydrazine compound, or a combination thereof.

17. The method as claimed in claim 15, wherein the reactive gas includes $O_2$, $O_3$, plasma $O_2$, $H_2O$, $NO_2$, NO, $N_2O$, $CO_2$, $H_2O_2$, HCOOH, $CH_3COOH$, $(CH_3CO)_2O$, and a combination thereof.

18. The method as claimed in claim 15, wherein the reactive gas includes $H_2$.

19. The method as claimed in claim 11, wherein forming the molybdenum-containing film includes:
vaporizing a source gas including the molybdenum compound;
forming a molybdenum source-adsorbed layer on the substrate by supplying the vaporized source gas onto the substrate; and
supplying a reactive gas onto the molybdenum source-adsorbed layer.

20. The method as claimed in claim 11, wherein the molybdenum-containing film includes a molybdenum film, a molybdenum oxide film, or a molybdenum nitride film.

* * * * *